United States Patent
Smith et al.

(10) Patent No.: US 10,490,805 B2
(45) Date of Patent: *Nov. 26, 2019

(54) VAPOUR DEPOSITION METHOD FOR FABRICATING LITHIUM-CONTAINING THIN FILM LAYERED STRUCTURES

(71) Applicant: Ilika Technologies Limited, Southampton, Hampshire (GB)

(72) Inventors: Duncan Clifford Alan Smith, North Baddesley (GB); Brian Elliott Hayden, Lyndhurst (GB); Christopher Edward Lee, Southampton (GB); Alexandros Anastasopoulos, Cambridge, MA (US); Laura Mary Perkins, Southampton (GB); Kyle James Hutchings, Salisbury (GB)

(73) Assignee: Ilika Technologies Limited, Romsey (GB)

( * ) Notice: Subject to any disclaimer, the term of this patent is extended or adjusted under 35 U.S.C. 154(b) by 264 days.

This patent is subject to a terminal disclaimer.

(21) Appl. No.: 15/110,598

(22) PCT Filed: Jan. 7, 2015

(86) PCT No.: PCT/GB2015/050013
§ 371 (c)(1),
(2) Date: Jul. 8, 2016

(87) PCT Pub. No.: WO2015/104538
PCT Pub. Date: Jul. 16, 2015

(65) Prior Publication Data
US 2016/0336583 A1 Nov. 17, 2016

(30) Foreign Application Priority Data
Jan. 8, 2014 (GB) .................... 1400276

(51) Int. Cl.
*H01M 4/04* (2006.01)
*C23C 14/58* (2006.01)
(Continued)

(52) U.S. Cl.
CPC ............. *H01M 4/0423* (2013.01); *C03C 4/18* (2013.01); *C23C 14/0021* (2013.01);
(Continued)

(58) Field of Classification Search
CPC combination set(s) only.
See application file for complete search history.

(56) References Cited

U.S. PATENT DOCUMENTS

| 4,374,162 A | 2/1983 | Takagi |
| 4,933,058 A | 6/1990 | Bache |

(Continued)

FOREIGN PATENT DOCUMENTS

| CN | 101479403 | 7/2009 |
| EP | 0454499 A2 | 10/1991 |

(Continued)

OTHER PUBLICATIONS

Notice of Reasons for Rejection for corresponding Japanese Patent Application No. 2016-526330 dated Feb. 13, 2018.
(Continued)

*Primary Examiner* — Amanda J Barrow
(74) *Attorney, Agent, or Firm* — Renner, Otto, Boisselle & Sklar, LLP

(57) ABSTRACT

A vapor deposition method for preparing a multi-layered thin film structure comprises providing a vapor source of each component element of a compound intended for a first layer and a compound intended for a second layer, wherein the vapor sources comprise at least a source of lithium, a source of oxygen, a source or sources of one or more glass-forming elements, and a source or sources of one or
(Continued)

more transition metals; heating a substrate to a first temperature; co-depositing component elements from at least the vapor sources of lithium, oxygen and the one or more transition metals onto the heated substrate wherein the component elements react on the substrate to form a layer of a crystalline lithium-containing transition metal oxide compound; heating the substrate to a second temperature within a temperature range of substantially 170° C. or less from the first temperature; and co-depositing component elements from at least the vapor sources of lithium, oxygen and the one or more glass-forming elements onto the heated substrate wherein the component elements react on the substrate to form a layer of an amorphous lithium-containing oxide or oxynitride compound.

15 Claims, 13 Drawing Sheets

(51) Int. Cl.
    *H01M 4/1391*     (2010.01)
    *H01M 4/525*     (2010.01)
    *H01M 10/0525*     (2010.01)
    *H01M 10/0585*     (2010.01)
    *H01M 4/505*     (2010.01)
    *C23C 14/06*     (2006.01)
    *H01M 10/0562*     (2010.01)
    *C03C 4/18*     (2006.01)
    *C23C 14/00*     (2006.01)
    *C23C 14/08*     (2006.01)
    *H01M 10/052*     (2010.01)
    *H01M 10/058*     (2010.01)
    *H01M 4/02*     (2006.01)

(52) U.S. Cl.
    CPC .......... *C23C 14/0676* (2013.01); *C23C 14/08* (2013.01); *C23C 14/58* (2013.01); *H01M 4/0421* (2013.01); *H01M 4/1391* (2013.01); *H01M 4/505* (2013.01); *H01M 4/525* (2013.01); *H01M 10/052* (2013.01); *H01M 10/058* (2013.01); *H01M 10/0525* (2013.01); *H01M 10/0562* (2013.01); *H01M 10/0585* (2013.01); *H01M 2004/028* (2013.01); *H01M 2300/0071* (2013.01)

(56) References Cited

U.S. PATENT DOCUMENTS

| | | | |
|---|---|---|---|
| 5,016,563 A | 5/1991 | Murakami et al. | |
| 5,128,007 A | 7/1992 | Matsunaga et al. | |
| 5,338,625 A | 8/1994 | Bates et al. | |
| 5,804,054 A | 9/1998 | Bhattacharya et al. | |
| 6,017,654 A | 2/2000 | Kumta et al. | |
| 6,632,563 B1* | 10/2003 | Krasnov | H01M 4/04 429/127 |
| 6,863,699 B1 | 3/2005 | Krasnov et al. | |
| 6,982,132 B1 | 1/2006 | Goldner et al. | |
| 7,883,800 B2 | 2/2011 | Vinatier et al. | |
| 2001/0032666 A1 | 10/2001 | Jenson | |
| 2003/0186128 A1 | 10/2003 | Singh | |
| 2004/0058237 A1* | 3/2004 | Higuchi | H01M 6/188 429/209 |
| 2004/0258984 A1 | 12/2004 | Ariel | |
| 2005/0016458 A1* | 1/2005 | Zhang | C23C 16/40 118/723 R |
| 2005/0130032 A1 | 6/2005 | Krasnov et al. | |
| 2009/0026065 A1 | 1/2009 | Nukeaw | |
| 2009/0057136 A1 | 3/2009 | Wang et al. | |
| 2009/0081554 A1 | 3/2009 | Takada | |
| 2010/0104942 A1 | 4/2010 | Lange | |
| 2010/0261071 A1* | 10/2010 | Lopatin | H01M 4/133 429/345 |
| 2012/0058280 A1* | 3/2012 | Chung | C23C 14/0031 427/551 |
| 2012/0058380 A1 | 3/2012 | Wang et al. | |
| 2012/0237835 A1 | 9/2012 | Yada | |
| 2012/0319034 A1 | 12/2012 | Awano | |
| 2013/0011738 A1 | 1/2013 | Zhou | |
| 2013/0189588 A1 | 7/2013 | Yada et al. | |
| 2015/0203975 A1 | 7/2015 | Hoormann | |
| 2016/0340772 A1 | 11/2016 | Smith et al. | |
| 2016/0340784 A1 | 11/2016 | Hayden et al. | |

FOREIGN PATENT DOCUMENTS

| | | | | |
|---|---|---|---|---|
| EP | 1900845 A1 | 3/2008 | | |
| EP | 2824738 A1 | 1/2015 | | |
| GB | 2493020 A | 1/2013 | | |
| GB | 2493022 | * 1/2013 | ............ C23C 14/06 | |
| JP | S3035493 | 2/1988 | | |
| JP | H01317199 A | 12/1989 | | |
| JP | H04187759 A | 7/1992 | | |
| JP | H08329944 | 12/1996 | | |
| JP | 2003-277915 A | 10/2003 | | |
| JP | 2005038844 A | 2/2005 | | |
| JP | 2006-120437 | 5/2006 | | |
| JP | 2013-151721 | 8/2013 | | |
| JP | 2013-187024 | 9/2013 | | |
| KR | 10-2004-0098139 | 11/2004 | | |
| KR | 20040098139 | 11/2004 | | |
| KR | 20080003679 | 1/2008 | | |
| WO | WO 2001/73883 A2 | 10/2001 | | |
| WO | WO 2001/73957 A2 | 10/2001 | | |
| WO | WO 2005/035820 A1 | 4/2005 | | |
| WO | WO 2013/011326 A1 | 1/2013 | | |
| WO | WO 2013/011327 | * 1/2013 | ............ C23C 14/06 | |
| WO | WO 2013/011327 A2 | 1/2013 | | |

OTHER PUBLICATIONS

Kim et al.; "Fabrication of a high lithium ion conducting lithium borosilicate glass", Journal of Non-Crystalline Solids, Apr. 15, 2011, vol. 357, Issue 15, pp. 2863-2867.
International Search Report and Written Opinion for corresponding Patent Application No. PCT/GB2015/050013 dated Mar. 25, 2015.
Combined Search and Examination Report for corresponding United Kingdom Patent Application No. GB 1400276.0 dated Jul. 9, 2014.
Search Report for corresponding United Kingdom Patent Application No. GB 1400276.0 dated Feb. 19, 2015.
Tang et al.; "Comparative study of $LiMn_2O_4$ thin film cathode grown at high, medium and low temperatures by pulsed laser deposition", Journal of Solid State Chemistry, 2006, vol. 179 (12), pp. 3831-3838.
Thornton et al.; "Sputter Deposition Processes", Handbook of Deposition Technologies for Films and Coatings, 1994, second edition, pp. 249-272.
Wang et al.; "High power and capacity of $LiNi_{0.5}Mn_{1.5}O_4$ thin films cathodes prepared by pulsed laser deposition", Electrochimica Acta. 2013, vol. 102, pp. 416-422.
Singh et al.; "Challenges in making of thin films for $Li_xMn_yO_4$ rechargeable lithium batteries for MEMS", Journal of Power Sources, 2001, vol. 97-98, pp. 826-831.
Jayanth Babu, et al.; "Microstructural and electrochemical properties of rf-sputtered $LiMn_2O_4$ thin film cathodes", Appl. Nanosci. 2012, vol. 2, pp. 401-407.
Baggetto et al.; "Fabrication and characterization of Li—Mn—Ni—O sputtered thin film high voltage cathodes for Li-ion batteries", Journal of Power Sources, 2012, vol. 211, pp. 108-118.
Zhong et al.; "Synthesis and Electrochemistry of $LiNi_xMn_{2-x}O_4$" Journal of Electrochemical Society, 1997, vol. 144(1), pp. 205-213.
Bates et al.; "Synthesis, Crystal Structure, and Ionic Conductivity of a Polycrystallin Lithium Phosphorus Oxynitride with the y—$Li_3PO_4$ Structure", Journal of Solid State Chemistry, 1995, vol. 115(2), pp. 313-323.

(56) References Cited

OTHER PUBLICATIONS

Bates et al.; "Rechargeable Thin Film Lithium Batteries", Oak Ridge National Lab and Solid State Ionics, 1993.
Tatsumisago et al.; "Mixed Anion Effect in Conductivity of Rapidly Quenched $Li_4SiO_4$—$Li_3BO_3$ Glasses", Yogyo-Kyokai-Shi, 1987, vol. 95(2), pp. 197-201.
Machida et al.; "Preparation of amorphous films in the systems $Li_2O_2$ and $Li_2O$—$B_2O_3$—$SiO_2$ by RF-sputtering and their ionic conductivity", Yogyo-Kyokai-shi, 1987, vol. 95(1), pp. 135-137.
Varshneya, A.K.; "Fundamentals of Inorganic Glasses", Academic Press, 1994, p. 33.
Guerin et al.; "Physical Vapor Deposition Method for the High-Throughput Synthesis of Solid-State Material Libraries", Journal of Combined Chemistry, 2006, vol. 8, pp. 66-73.
Chen et al.; "High rate performance of $LiMn_2O_4$ cathodes for lithium ion batteries synthesized by low temperature oxygen plasma assisted sol-gel process", Thin Solid Films, 2013, vol. 544, pp. 182-185.
Park et al.; "Characterization of tin oxide/$LiMn_2O_4$ thin-film cell", Journal of Power Sources, 2000, vol. 88, pp. 250-254.
English translation of the First Office Action issued from the State Intellectual Property Office of the PR China for Chinese Patent Application 201580002883.2 dated Jun. 22, 2017.
English translation of the Second Office Action issued from the State Intellectual Property Office of the PR China for Chinese Patent Application 201580002883.2 dated Feb. 7, 2018.
Office Action issued from Japanese Intellectual Property Office for Japanese Patent Application 2016-544673 dated May 1, 2017 and English translation.
Search Report issued from the European Patent Office for European Patent Application 17201720.4-1103 dated Feb. 5, 2018.
Choi et al.; "Radio-Frequency Magnetron Sputtering Power Effect on the Ionic Conductivities of Lipon Films", Electrochemical and Solid-State Letters, 2002, vol. 5(1), pp. A14-A17.
Hu et al.; "Influence of sputtering pressure on the structure and ionic conductivity of thin film amorphous electrolyte", Journal of Material Science, 2011, vol. 46, pp. 7588-7593.
Joo et al.; "Thin film lithium ion conducting LiBSO solid electrolyte", Solid State Ionics, 2003, vol. 160, pp. 51-59.
Sahan et al., "Improvement of the electrochemical performance of LiMn2O4 cathode active material by lithium borosilicate (LBS) surface coating for lithium-ion batteries", Journal of Alloys and Compounds, Jan. 14, 2011, vol. 509, No. 11, pp. 4235-4241.
Zhao et al.; "A solid-state electrolyte lithium phosphorus oxynitride film prepared by pulsed laser deposition", Thin Solid Films, 2002, vol. 415, pp. 108-113.
Beal et al.; "High Throughput Methodology for Synthesis, Screening, and Optimization of Solid State Lithium Ion Electrolytes", ACS Combinatorial Science, 2011, vol. 13 Issue 4, pp. 375-338.
Office Action for corresponding Japanese Patent Application No. 2016-526330 dated Feb. 13, 2018 (with English translation).
Julien et al.; "Chapter 4, Materials for electrolyte: Thin Films", Solid State Batteries: Materials Design and Optimization, 1994, pp. 285-298.
Julien et al.; "Chapter 1. Design and Optimisation of Solid State Batteries", Solid State Batteries: Materials Design and Optimization, 1994, pp. 49-51.
Samuneva et al. Structure and optical properties of niobium silicate glasses. Journal of Non-crystalline solids. vol. 129, Issues 1-3. Mar. 1991, pp. 54-63.

\* cited by examiner

VAPOUR DEPOSITION METHOD FOR FABRICATING LITHIUM-CONTAINING THIN FILM LAYERED STRUCTURES

This application is a national phase of International Application No. PCT/GB2015/050013 filed Jan. 7, 2015 and published in the English language, which claims priority to United Kingdom Patent Application No. 1400276.0 filed Jan. 8, 2014, which are hereby incorporated herein by reference in their entirety.

BACKGROUND OF THE INVENTION

The present invention relates to a method for fabricating thin film layered structures containing lithium compounds by vapour deposition.

The deposition of materials in thin film form is of great interest owing to the many applications of thin films, and a range of different deposition techniques are known. Various of the techniques are more or less suitable for particular materials, and the quality, composition and properties of the thin film produced typically depends greatly on the process used for its formation. Consequently, much research is devoted to developing deposition processes that can produce thin films appropriate for specific applications.

An important application of thin film materials is in solid state thin film cells or batteries, such as lithium ion cells. Such batteries are composed of at least three components. Two active electrodes (the anode and the cathode) are separated by an electrolyte. Each of these components is formed as a thin film, deposited in sequence on a supporting substrate. Additional components such as current collectors, interface modifiers and encapsulations may also be provided. In manufacture, the components may be deposited in the order of cathode current collector, cathode, electrolyte, anode, anode current collector and encapsulation, for example. The structure of these batteries places additional burdens on the deposition processes of the individual components, since the fabrication of a particular layer should not have a detrimental effect on any layers already deposited.

In the lithium ion battery example, the anode and the cathode are capable of reversibly storing lithium. Other requirements of the anode and cathode materials are high gravimetric and volumetric storage capacities which can be achieved from a low mass and volume of material, while the number of lithium ions stored per unit should be as high as possible. The materials should also exhibit acceptable electronic and ionic conduction so that ions and electrons can move through the electrodes during the battery charge and discharge process.

Otherwise, the anode, cathode and electrolyte require different properties. The cathode should present reversible lithium intercalation at high potentials, while the anode should present reversible lithium intercalation at low potentials.

The electrolyte physically separates the anode and cathode, so it must have extremely low electrical conductivity to prevent short circuiting of the battery. However, to enable reasonable charge and discharge properties the ionic conductivity of the material must be as high as possible. Furthermore the material must be stable during the cycling process and not react with either the cathode or the anode.

The manufacture of solid state batteries poses a range of challenges. In particular, reliable and efficient techniques for producing materials suitable for use as cathodes are of great interest. For several popular cathode materials, the cathode layer of the battery is required to have a crystalline structure to provide the required properties outlined above. However, depositing a quality crystalline cathode layer in a way which is compatible with subsequent steps in the manufacturing and processing of the complete battery is often problematic. Electrolyte materials are often preferred or required to be amorphous, and further challenges have been the identification of solid electrolytes with sufficiently high ionic conductivity, low electronic conductivity, and low mechanical stress resulting from the required electrochemical cycling and reproducible high yield production methods.

Many different methods of depositing the components of thin film batteries are known. Synthetic routes to thin films, which are generally referred to using the umbrella term of 'physical vapour deposition' include: pulsed laser deposition (Tang, S. B., et al., J. Solid State Chem., 179(12), (2006), 3831-3838), flash evaporation (Julien, C. M. and G. A. Nazri, Chapter 4. *Materials for electrolyte: Thin Films, in Solid State Batteries: Materials Design and Optimization* (1994)), sputtering, and thermal evaporation.

Of these sputtering is the most widespread deposition technique. In this method a target of a particular composition is sputtered using plasma formed over the target and the resulting vapour condenses on a substrate to form the thin film. Sputtering involves the deposition of materials directly from a target. The product of the sputter varies and may include dimers, trimers or higher order particles (Thornton, J. A. and J. E. Greene, *Sputter Deposition Processes, in Handbook of Deposition Technologies for films and coatings*, R. F. Bunshah, Editor 1994, Noyes Publications). The deposition rate, composition, morphology, crystallinity and performance of thin films are determined by a complex relationship with the sputtering parameters used.

Sputtering can be disadvantageous in that it is difficult to predict the effect of the various sputtering parameters on the characteristics and performance of the deposited material. In part this is due to the confounding of deposition parameters with film characteristics. The deposition rate, composition, morphology, crystallinity and performance of sputtered thin films are determined by a complex relationship with the sputtering parameters used. Hence, it can be very difficult to alter the individual parameters of the sputtered film (for example, concentration of a single element, deposition rate or crystallinity) without affecting other properties of the film. This results in difficulties in achieving a composition of interest, which makes optimisation of the film and therefore of the properties of any intended battery or other thin film device extremely problematic.

The technique of pulsed laser deposition (PLD) shares many properties with sputtering, due to the use of a compositionally unique target and the use of high energies. In addition, this route often yields very rough samples, which is also a problem with sputtering. The surface morphology of $LiMn_{1.5}Ni_{0.5}O_4$ thin films prepared by PLD has been noted to be rough, with formation of grains with sizes from 30 nm upwards dependent on the temperature of the deposition (Wang et al. Electrochimica Acta 102 (2013) 416-422). Surface roughness is highly undesirable in layered thin film structures such as a solid state battery, where any large protruding features could extend well into, or even through, an adjacent layer.

Deposition of thin films from thermal evaporation of compound sources has been demonstrated in the synthesis of battery components for materials such as $LiMn_2O_4$ (LMO, lithium manganese oxide) and $B_2O_3$—$Li_2O$ (Julien, C. M. and G. A. Nazri, Chapter 4. *Materials for electrolyte: Thin Films, in Solid State Batteries: Materials Design and Optimization* (1994)). In this instance the particle energies are much lower than those encountered in sputtering, which can inhibit cluster formation, reduce surface roughness and provide smooth, undamaged surfaces. However, problems such as variation in composition between source and resultant thin film are common to all routes which begin with compound evaporation targets (including sputtering and PLD). Furthermore it has been noted that a relationship between substrate temperature and the composition of the deposited film exists once again resulting in difficulties in optimising material performance due to a confounding of parameters.

An alternative is thermal evaporation directly from the elements, but this is uncommon. Julien and Nazri (*Chapter 4. Materials for electrolyte: Thin Films, in Solid State Batteries: Materials Design and Optimization* (1994)) allude to an attempt to synthesize $B_2O_3$-$xLi_2O$-$yLi_nX$ (X=I, Cl, $SO_4$ and n=1, 2) directly from the elements, but no results are reported and the authors comment that "the difficulties in implementing this technique stay in enhancing the oxygen pumping, avoiding the high oxygen reactivity with the heated parts of the system, and making available an oxygen monoatomic source in order to enhance oxygen reactions on the surface".

Previously, the present inventors have demonstrated the synthesis of phosphorous-containing materials, suitable for some thin film battery components, directly from the constituent elements (WO 2013/011326; WO 2013/011327). However, a complexity in this process is the use of a cracker to break down phosphorous so as to enable the formation of phosphates. The synthesis of cathode (lithium iron phosphate (LFP)—example 5, lithium manganese phosphate (LMP)—example 7) and electrolyte materials ($Li_3PO_4$—example 1 and nitrogen doped $Li_3PO_4$—example 6) is disclosed. The deposited materials are amorphous, so annealing is used to crystallise the cathode materials, at temperatures of 500° C. and 600° C. for LFP and LMP respectively. Although this work demonstrates two of the three basic building blocks for producing a thin film cell, it does not demonstrate an operational cell. Furthermore, the ionic conductivities demonstrated in this work are too low to enable a cell to function correctly at room temperature. It is widely known that a conductivity of $1\times10^{-6}$ S cm$^{-1}$ at room temperature is required for satisfactory performance, but this was not demonstrated.

State of the art cathode materials such as $LiMn_2O_4$ (LMO) and $LiMn_{1.5}Ni_{0.5}O_4$ (LMNO) are required to be in the crystalline state to achieve optimum ionic conductivity. This can be achieved by either a low temperature deposition followed by post annealing, or depositing at high substrate temperatures. Cathodes deposited at low substrate temperatures (below 250° C.) are often insufficiently crystalline, resulting in reduced performance. Therefore, a further crystallisation step is required; this is typically achieved by a post-deposition, high temperature anneal, although this step can result in a lithium deficiency in the film (Singh et al. J. Power Sources 97-98 (2001), 826-831). Samples of LMO deposited by RF-sputtering on to a heated substrate have been found to have an initial crystallization temperature of 250° C., while films grown using a substrate temperature below 200° C. exhibited a broad and diffuse XRD pattern, consistent with materials that are X-ray amorphous (Jayanth et al. Appl Nanosci. (2012) 2:401-407).

Crystalline $LiNi_{0.5}Mn_{1.5}O_4$ (LMNO) thin films have been deposited using PLD at higher substrate temperatures, between 550 and 750° C. followed by a post anneal for one hour at the same temperature (Wang et al. Electrochimica Acta 102 (2013) 416-422). Using high substrate temperatures such as these has certain disadvantages. Loss of lithium is more significant at higher temperatures, and there is the possibility of cross contamination due to diffusion of materials between the deposited film and the substrate, which limits the possible substrates available for use.

The process of annealing, which involves exposing a material to a high temperature to crystallise it, is potentially applicable whenever a deposited material is insufficiently crystalline. The temperature required will depend on the material, but is typically at least 500° C. and may be significantly higher, and the resulting crystalline layer may be of poor quality. As an example, the cathode material lithium manganese nickel oxide (LMNO; $LiMn_{1.5}Ni_{0.5}O_4$) has been crystallised by annealing sputtered thin films, but the resulting layers are polycrystalline and composed of grains with diameters between 50-150 nm. The films have also been shown to contain a number of impurity phases (Baggetto et al., J Power Sources 211 (2012) 108-118).

Also, annealing is an undesirable complexity, and is particularly problematic in the manufacture of a complete battery or other layered device. As discussed, solid state batteries based on state of the art materials require crystalline electrodes (such as cathodes made from $LiCoO_2$, $LiMnO_4$, $LiMn_{1.5}Ni_{0.5}O_4$), and amorphous electrolytes (such as LiPON). This requirement means it has generally been necessary to anneal the cathode prior to the deposition of the electrolyte layer, to avoid crystallisation of the electrolyte. This step requires both time and energy to provide sufficient crystallisation. Furthermore, one or more high temperature processing steps (e.g. $LiMn_{1.5}Ni_{0.5}O_4$: 550-750° C. for PLD (Wang, Y., et al., Electrochimica Acta, (2013), 102(0), 416-422) and multiple anneals at 750-800° C. for sol-gel and solid state synthesis (Zhong, Q., et al., J. Electrochem. Soc., (1997), 144(1), 205-213) are typically required, thereby limiting components such as the substrate to those compatible with such high temperature processing. Additionally such a process prevents the deposition of an additional cell onto an existing one to produce a stack of cells, since any amorphous electrolyte already deposited must also be annealed, causing crystallisation. Such crystallisation is known to cause a dramatic reduction in the ionic conductivity of the state of the art electrolyte, LiPON. The conductivity of crystalline LiPON is known to be by seven orders of magnitude lower than that of the amorphous material (Bates et al. Synthesis, Crystal Structure, and Ionic Conductivity of a Polycrystalline Lithium Phosphorus Oxynitride with the $\gamma$-$Li_3PO_4$ Structure. *Journal of Solid State Chemistry* 1995, 115, (2), 313-323). Further problems associated with such high temperature processing include delamination and cracking of individual layers.

Techniques have been proposed to address these problems. For example, it has been shown that by providing a focused beam of ions it is possible to deposit crystalline films in-situ (WO 2001/73883). In this case adatoms (defined in this case as a particle, molecule or ion of material that has not yet been formed into a structure or film) of a cathode material were deposited onto the substrate while a second flux of ions supplied energy to the cathode material. A flux of the second material provided energy to the first material to assist in the growth of a desirable crystalline material. This has been demonstrated for $LiCoO_2$ as a cathode. In the case of $LiCoO_2$ a beam of $O_2$ ions was utilized. This beam of oxygen is noted to have two functions, both controlling the crystallization and the stoichiometry of $LiCoO_2$ (EP 1,305,838). The beam of ions addresses three problems encountered in the preparation of thin films—that of compositional control, preparation of dense films and crystallisation of the resultant films. However, the ion beam is a complicating aspect of the process.

Turning to the electrolyte component of the battery, both crystalline and non-crystalline (amorphous) electrolyte materials have been considered. Crystalline materials such as lithium lanthanum titanate (LLTO), thio-LISICON, NASICON-type $(Li_{1+x+y}Al_x(Ti,Ge)_{2-x}Si_yP_{3-y}O_{12})$, and $Li_{10}GeP_2S_{12}$ generally exhibit excellent ionic conductivity (for example up to $1.2\times10^{-2}$ S cm$^{-1}$ in the case of $Li_{10}GeP_2S_{12}$) so appear to be good candidates for electrolytes. However, these materials present problems when applied to battery systems. In the case of the oxides (LLTO, thio-LISICON and NASICON-type) the transition metals within the electrolyte are prone to reduction which causes the material to exhibit electronic conductivity and thus short circuit the battery. The sulphide systems, such as $Li_{10}GeP_2S_{12}$, present extremely high conductivities but are prone to decomposition when exposed to air and water, causing the release of toxic $H_2S$ and a deterioration in performance. Furthermore, both oxide and sulphide crystalline electrolytes require extremely high processing temperatures. For these reasons crystalline electrolytes have not been utilised in commercial thin film battery systems.

Amorphous electrolytes such as lithium phosphorous oxynitride (LiPON), lithium silicate and lithium borosilicates exhibit much lower levels of ionic conductivity. Although the optimum conductivity of these materials is at least two orders of magnitude lower than that of the crystalline materials, this has been determined to be acceptable if the electrolyte is less than $1\times10^{-6}$ m thick (Julien, C. M.; Nazri, G. A., Chapter 1. Design and Optimisation of Solid State Batteries. In *Solid State Batteries: Materials Design and Optimization*, 1994). LiPON has an acceptable ionic conductivity of $3\times10^{-6}$ S cm$^{-1}$ and has been shown to be stable in air and when cycled against lithium. For these reasons, coupled with its ease of manufacture, it has been widely adopted in the first generation of solid state batteries (Bates, J. B.; Gruzalski, G. R.; Dudney, N. J.; Luck, C. F.; Yu, X., Rechargeable Thin Film Lithium Batteries. *Oak Ridge National Lab and Solid State Ionics* 1993; U.S. Pat. No. 5,338,625). The amorphous nature of these electrolytes is critical to their performance; crystalline LiPON has an ionic conductivity seven orders of magnitude lower than the amorphous material. However, the amorphous LiPON will crystallise at temperatures lower than those typically needed to anneal cathode materials such as LMO ($LiMn_2O_4$, lithium manganese oxide) and LMNO ($LiMn_{1.5}Ni_{0.5}O_4$, lithium manganese nickel oxide) using standard synthesis techniques, thereby complicating the manufacture of a thin film battery comprising these materials.

Hence, amorphous electrolytes are of great interest. An alternative to LiPON is amorphous lithium borosilicate. Amorphous lithium borosilicate materials with ionic conductivity comparable to LiPON have been produced, but by methods requiring rapid quenching (Tatsumisago, M.; Machida, N.; Minami, T., Mixed Anion Effect in Conductivity of Rapidly Quenched $Li_4SiO_4$—$Li_3BO_3$ Glasses. *Yogyo-Kyokai-Shi* 1987, 95, (2), 197-201). This synthetic method gives rise to irregular 'splats' of glass, which are not suitable for processing into thin film batteries. Synthesis by sputtering of similar compositions has been attempted in thin films, but these were not successful, resulting in materials with significantly reduced conductivities when compared to the rapidly quenched glass (Machida, N.; Tatsumisago, M.; Minami, T., Preparation of amorphous films in the systems $Li_2O_2$ and $Li_2O$—$B_2O_{3-Si}O_2$ by RF-sputtering and their ionic conductivity. *Yogyo-Kyokai-Shi* 1987, 95, (1), 135-7).

The inventors' previous work (WO 2013/011326; WO 2013/011327) showing the deposition of thin films of phosphate materials from constituent elements suggests that the technique might be possible for other materials, such as lithium borosilicate. However, it has been found that following the method described for phosphates while using the constituent elements of lithium borosilicate does not produce the desired thin film material. The elements fail to react on the substrate in the manner expected from the phosphate work so that the required compound is not created. Using molecular oxygen instead of atomic oxygen overcomes this problem, however the lithium borosilicate phase of interest is only achieved when the substrate temperature is low (room temperature). Deposition of lithium borosilicate utilising molecular oxygen at elevated temperatures results in the formation of crystalline $LiPt_7$ when deposited onto platinum substrates, an unwanted phase. Furthermore, Raman spectra of the materials deposited at elevated temperatures do not exhibit the bands associated with the lithium borosilicate phase of interest. Also, the resulting amorphous lithium borosilicate will crystallise when subjected to the elevated temperatures required for producing and processing other components of a battery, or if the battery is for use at high temperature, thereby destroying its electrolyte qualities.

The efforts required to overcome these many difficulties in the various deposition processes and the complexities involved in developing new materials mean that the vast majority of thin film batteries are limited to using LiPON as an electrolyte, deposited as a thin film by sputtering.

Clearly, improved methods of making thin films of other electrolyte materials are desirable, plus there is a need for an improved and simplified method of depositing crystalline materials suitable for use as electrodes in thin film batteries. Additionally, incompatibilities between methods for forming crystalline and amorphous materials need to be addressed so that the fabrication and performance of thin film batteries and other layered thin film devices can be improved.

SUMMARY OF THE INVENTION

Accordingly, a first aspect of the present invention is directed to a vapour deposition method for preparing a multi-layered thin film structure, the method comprising: providing a vapour source of each component element of a compound intended for a first layer and a compound intended for a second layer, wherein the vapour sources comprise at least a source of lithium, a source of oxygen, a source or sources of one or more glass-forming elements, and a source or sources of one or more transition metals; heating a substrate from a backside of the substrate to a first temperature; co-depositing component elements from at least the vapour sources of lithium, oxygen and the one or more transition metals onto a front side of the heated substrate wherein the component elements react on the substrate to form a layer of a crystalline lithium-containing transition metal oxide compound; heating the substrate from the backside of the substrate to a second temperature; and co-depositing component elements from at least the vapour sources of lithium, oxygen and the one or more glass-forming elements onto the front side of the heated substrate wherein the component elements react on the substrate to form a layer of an amorphous lithium-containing oxide or oxynitride compound; wherein the first temperature and the second temperature fall within a temperature range, wherein a span of the temperature range is 170° C. or less.

Not only does this vapour deposition technique provide a very simple method for forming crystalline lithium-containing transition metal oxide compounds and amorphous lithium-containing oxide and oxynitride compounds in their own right, but further provides an excellent means to deposit layers of the two materials during a single process in a way that is not detrimental to either material. This stems from using substrate temperatures which are substantially the same to deposit the different layers; the temperature range encompasses appropriate deposition conditions for both amorphous and crystalline materials, but is small enough to enable potentially detrimental extreme temperatures to be avoided. Also, the energies of evaporated particles from vapour sources are significantly lower than the particle energies encountered in known techniques such as sputtering, and the lower energy of the particles prevents cluster formation, reduces roughness and provides smooth, undamaged surfaces to the layers. While clearly of general benefit, this advantage is critical when depositing layers of material within devices which may be composed of thin film with thicknesses less than 1 μm. Thus, high quality thin films with precise physical and chemical structure can be produced, and multi-layer thin film structures and devices which incorporate layers of both amorphous and crystalline materials can be readily fabricated.

There are other advantages. The deposition of one of the layers directly in the crystalline form reduces processing complexity compared to known deposition techniques that require post-annealing or an ion beam to produce crystallisation. For example, methods of the present invention simplify the known synthesis method described in EP1,305,838 by removing the requirement for a secondary source to provide energised material at a site adjacent to the location of deposition.

The layers may be deposited in any order. Hence, in some embodiments, the layer of a crystalline lithium-containing transition metal oxide compound is deposited before the layer of an amorphous lithium-containing oxide or oxynitride compound, while in other embodiments the layer of an amorphous lithium-containing oxide or oxynitride compound is deposited before the layer of a crystalline lithium-containing transition metal oxide compound.

In some embodiments, the temperature range may be substantially from 180° C. to 350° C.

Smaller temperature ranges can also be accommodated, so that, for example, the first and second temperatures may be within a range of substantially 150° C. or less, or substantially 100° C. or less, or substantially 75° C. or less, or substantially 50° C. or less, or substantially 25° C. or less, or substantially 10° C. or less, or substantially 5° C. or less. These give an effectively quasi-isothermal process, where two or more layers can be deposited at similar temperatures. Alternatively, the process may be isothermal, so that the first temperature and the second temperature are substantially equal. Any of these options improves greatly over known techniques for fabricating amorphous and crystalline thin films, which can require temperatures which differ by 500° C. or more.

As examples, the first temperature may be substantially 350° C. and the second temperature may be substantially 225° C., or the first temperature and the second temperature may both be substantially 225° C.

The source or sources of one or more transition metals may comprise a source of manganese so that the crystalline lithium-containing metal oxide compound is lithium manganese oxide, or a source of manganese and a source of nickel so that the crystalline lithium-containing metal oxide compound is lithium manganese nickel oxide.

Alternatively, the source or sources of one or more transition metals may comprise a source of each of one or more of scandium, titanium, vanadium, chromium, manganese, iron, cobalt, nickel, copper, zinc, yttrium, zirconium, niobium, molybdenum, technetium, ruthenium, rhodium, palladium, silver, cadmium, lutetium, hafnium, tantalum, tungsten, rhenium, osmium, iridium, platinum, gold and mercury. Of particular interest for depositing materials suitable for cathodes and anodes are cobalt, nickel, manganese, iron, vanadium, molybdenum, titanium, copper and zinc.

The vapour sources may further comprise a source of nitrogen, so that the amorphous compound may be a lithium-containing oxynitride compound.

The source or sources of one or more glass-forming elements may comprise a source of boron and a source of silicon so that the amorphous lithium-containing oxide or oxynitride compound is lithium borosilicate, or the source or sources of one or more glass-forming elements may comprise a source of boron and a source of silicon while the vapour sources further comprises a source of nitrogen, so that the amorphous lithium-containing oxide or oxynitride compound is nitrogen-doped lithium borosilicate.

In other embodiments, the amorphous lithium-containing oxide or oxynitride compound may be a lithium silicate, an oxynitride lithium silicate, a lithium borate or an oxynitride lithium borate. Other lithium-containing oxide and oxynitrides are not precluded, however, and appropriate vapour sources can be provided accordingly. For example, the source or sources of one or more glass-forming elements may comprise sources of one or more of boron, silicon, germanium, aluminium, arsenic and antimony.

In some embodiments, the layer of an amorphous lithium-containing oxide or oxynitride compound may be deposited onto the layer of a crystalline lithium-containing transition metal oxide compound. The layer of crystalline lithium-containing transition metal oxide compound may be deposited to form a cathode of a thin film battery and the layer of an amorphous lithium-containing oxide or oxynitride compound may be deposited to form an electrolyte of a thin film battery.

The method may further comprise forming one or more further layers on the layer of a crystalline lithium-containing transition metal oxide compound and/or the layer of an amorphous lithium-containing oxide or oxynitride compound.

The vapour deposition method may be extended, so that at least one further layer is formed by co-depositing component elements of a compound intended for the further layer from vapour sources of each component element onto the substrate wherein the component elements react on the substrate to form a layer of the compound intended for the further layer. The substrate is heated to a third temperature when the third layer is formed, and the first temperature, the second temperature and the third temperature may be within a temperature range of substantially 170° C. or less. The first temperature, the second temperature and the third temperature may be substantially equal.

The layer of crystalline lithium-containing transition metal oxide compound may be deposited to form a cathode of a thin film battery, the layer of an amorphous lithium-containing oxide or oxynitride compound may be deposited to form an electrolyte of a thin film battery, and the one or more further layers may comprise at least an anode of a thin film battery.

Further, the layer of crystalline lithium-containing transition metal oxide compound may be deposited to form a cathode of a first thin film battery, the layer of an amorphous lithium-containing oxide or oxynitride compound may be deposited to form an electrolyte of the first thin film battery, and the one or more further layers may comprise at least an anode of the first thin film battery and a cathode, electrolyte and anode of a second thin film battery formed on the first thin film battery to form a battery stack.

A second aspect of the present invention is directed to a method of making a battery, comprising depositing a cathode of the battery as a layer of a crystalline lithium-containing transition metal oxide compound and an electrolyte of the battery as a layer of an amorphous lithium-containing oxide or oxynitride compound using a vapour deposition method according to the first aspect.

A third aspect of the present invention is directed to a battery comprising a cathode in the form of a layer of a crystalline lithium-containing transition metal oxide compound and an electrolyte in the form of a layer of an amorphous lithium-containing oxide or oxynitride compound, the cathode and the electrolyte deposited using a vapour deposition method according to the first aspect.

A fourth aspect of the present invention is directed to an electronic device comprising a battery having a cathode in the form of a layer of a crystalline lithium-containing transition metal oxide compound and an electrolyte in the form of a layer of an amorphous lithium-containing oxide or oxynitride compound, the cathode and the electrolyte deposited using a vapour deposition method according to the first aspect.

A fifth aspect of the present invention is directed to a sample comprising a layer a crystalline lithium-containing transition metal oxide compound and a layer of an amorphous lithium-containing oxide or oxynitride compound deposited on a substrate using a vapour deposition method according to the first aspect.

A sixth aspect of the present invention is directed to a battery stack comprising a first thin film cell and at least one second thin film cell stacked on the first thin film cell, wherein each thin film cell comprises a cathode comprising a layer of a crystalline lithium-containing transition metal oxide compound and an electrolyte comprising a layer of an amorphous lithium-containing oxide or oxynitride compound. The crystalline lithium-containing transition metal oxide compound may comprise lithium manganese oxide or lithium manganese nickel oxide. The amorphous lithium-containing oxide or oxynitride compound may comprise lithium borosilicate or nitrogen-doped lithium borosilicate.

BRIEF DESCRIPTION OF THE DRAWINGS

For a better understanding of the invention and to show how the same may be carried into effect reference is now made by way of example to the accompanying drawings in which.

DETAILED DESCRIPTION

Figure 1:
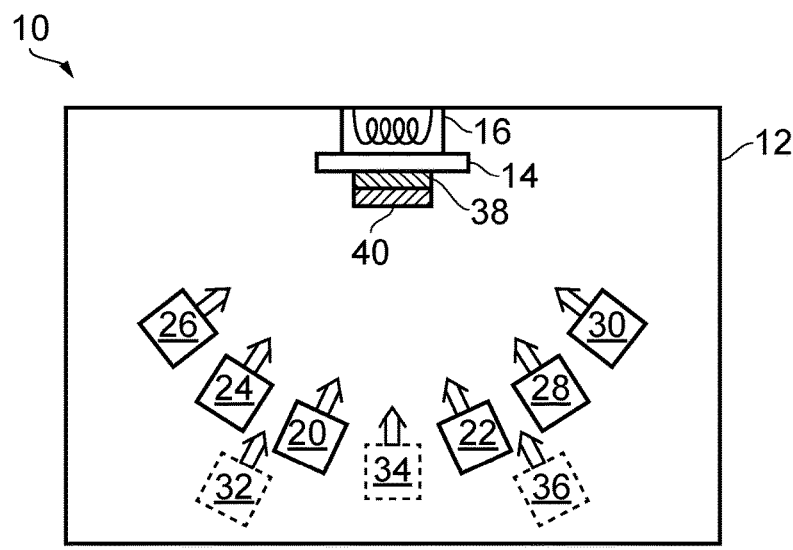
FIG. 1 shows a schematic representation of an example apparatus suitable for implementing a method according to embodiments of the invention.

The present invention provides a method for sequentially depositing at least two thin film layers of a thin film structure by vapour deposition. The at least two layers comprise lithium-containing compounds, one amorphous and one crystalline. Each component element of the compound of each layer is provided as a vapour from a respective source, and the component element vapours for a first layer are co-deposited onto a common heated substrate. The component elements react on the substrate to form the compound of the first layer. The component element vapours for a second layer are then co-deposited onto the heated substrate, where the elements react to form the compound of the second layer.

One of the layers comprises a crystalline lithium-containing transition metal oxide compound. Another layer comprises an amorphous lithium-containing oxide or oxynitride compound.

In the context of this disclosure, the term "element" means "element of the periodic table". The crystalline lithium-containing transition metal oxide compounds formed according to the invention therefore comprise component elements including lithium (Li), oxygen (O), and one or more transition metals. Other component elements will depend on the particular crystalline compound being formed. The amorphous lithium-containing oxide or oxynitride compounds formed according to the invention comprise component elements including lithium (Li) and oxygen (O) in the case of oxide compounds and lithium (Li), oxygen (O) and nitrogen (N) in the case of oxynitride compounds. Additionally, one or more of the component elements comprise glass-forming elements.

Other component elements will depend on the particular amorphous compound being formed. In all cases, for both the crystalline and amorphous compounds, each element in the compound is provided separately in the form of a vapour (or combined into a mixed vapour or plasma if appropriate), and each vapour for the first layer deposits onto a common substrate, followed by the deposition of each vapour for the second layer onto the same substrate.

Also in the context of this disclosure, the term "lithium-containing transition metal oxide compound" means "a compound containing lithium, oxygen, one or more transition metals, and possibly one or more other elements". The term "lithium-containing oxide compound" means "a compound containing lithium, oxygen and one or more other elements", and the term "lithium-containing oxynitride compound" means "a compound containing lithium, oxygen, nitrogen and one or more other elements". "A compound" is "a substance or material formed by the combination of two or more elements in fixed proportions by a chemical reaction".

In the context of this disclosure, the term "crystalline" means "a solid that has a regular internal arrangements of atoms, ions or molecules characteristic of crystals", i.e. that has a long range order in its lattice. It has been found that, according to the methods of the present invention, a desired compound can be deposited in crystalline form at moderate temperatures (described further below) when one or more of the component elements from which the compound is deposited is a transition metal element. In the context of this disclosure, a "transition metal" means "any element in the d-block of the periodic table, being groups 3 to 12 on the periodic table, plus any element in the f-block lanthanide and actinide series (also known as "inner transition metals")". Transition metals with an atomic number of 72 and below are of particular interest, owing to their smaller size and weight; these are scandium, titanium, vanadium, chromium, manganese, iron, cobalt, nickel, copper, zinc, yttrium, zirconium, niobium, molybdenum, technetium, ruthenium, rhodium, palladium, silver, cadmium, lutetium and hafnium, especially cobalt, nickel, manganese, iron, vanadium, molybdenum, titanium, copper and zinc for use in materials intended as electrodes. However, heavier transition metals such as tantalum, tungsten, rhenium, osmium, iridium, platinum, gold, mercury, and beyond are not precluded.

Further in the context of this disclosure, the term "amorphous" means "a solid that is not crystalline", i.e. that has no long range order in its lattice. It has been found that, according to the methods of the present invention, a desired compound can be deposited in amorphous form at the substrate temperatures of the invention if one or more of the component elements from which the compound is deposited is a glass-forming element. Examples of glass-forming elements include boron (B), silicon (Si), germanium (Ge), aluminium (Al), arsenic (As) and antimony (Sb) (Varshneya, A. K., *Fundamentals of Inorganic Glasses*, Academic Press, page 33).

FIG. 1 shows a schematic representation of an example apparatus 10 suitable for implementing an embodiment method of the invention. The deposition is carried out within a vacuum system 12, which may be an ultrahigh vacuum system. A substrate 14 of a desired material (depending on the intended purpose of the deposited thin film layers) is mounted within the vacuum system 12, and heated above room temperature using a heater 16. The temperature is discussed further below. Also within the vacuum system are a plurality of vapour sources, one source for each of the component elements in each of the desired thin film compounds. A first vapour source 20 comprises a source of atomic oxygen, such as an oxygen plasma source. A second vapour source 22 comprises a source of lithium vapour. These are used for both the crystalline and amorphous compounds. For the lithium-containing oxide or oxy-nitride, a third vapour source 24 comprises a source of vapour of a glass-forming element, while fourth vapour source 26 comprises a source of any further component element of the desired compound. As shown in the illustrated embodiment, the substrate 14 is heated via the heater 16 from a backside of the substrate 14, and the component elements from the vapor sources 20, 22, 24, 26 are co-deposited onto a front side of the substrate 14 to form the respective layers of crystalline and amorphous compounds, as explained in further detail below.

For the lithium-containing transition metal oxide, a fifth vapour source 28 comprises a source of vapour of a transition metal element. Sixth vapour source 30 may comprises a source of a further transition metal element, depending on the component elements of the desired transition metal oxide compound. Then, for either layer, any number of other vapour sources (such as 32, 34 and 36, shown in phantom) may optionally be included depending on the number of elements comprised in the compound materials of interest. For example, if the amorphous compound is an oxynitride compound, one of the vapour sources may be a source of nitrogen. Alternatively, in a case where oxygen is provided from a plasma source, the nitrogen may be introduced though the plasma source to create a mixed nitrogen-oxygen plasma.

The nature of each vapour source will depend on the element it delivers, and also the amount of control required over the rate of delivery, or flux. A source may be a plasma source, for example, particularly in the case of the oxygen vapour source. A plasma source delivers plasma-phase oxygen, i.e. a flux of oxygen atoms, radicals and ions. The source may be a radio frequency (RF) plasma source, for example. Atomic oxygen is advantageous when depositing compounds that comprise elements in high oxidation states. Oxygen may alternatively be provided using an ozone source. A plasma source such as an RF plasma source may also be used to deliver the nitrogen component vapour, if an oxynitride compound is to be formed or the transition metal oxide is to contain nitrogen.

Electron beam evaporators and Knudsen cells (K-Cells) are other examples of vapour sources; these are well-suited for materials with low partial pressures. In both cases the material is held in a crucible and heated to generate a flux of material. A Knudsen cell uses a series of heating filaments around the crucible, whereas in an electron beam evaporator the heating is achieved by using magnets to direct a beam of high energy electrons onto the material.

Other example vapour sources are effusion cells and cracking sources. Embodiments of the invention eliminate any need for cracking, however, and thereby avoid the complexity inherent in the use of such sources. Further alternative vapour sources will be evident to the skilled person.

During the deposition process, a first thin film layer 38 is deposited initially. If the layers are to be part of a thin film cell, the first layer 38 may be a layer of crystalline lithium-containing transition metal oxide intended as a cathode of the cell. To achieve this, a controlled flux of each component element in the lithium-containing transition metal oxide is released from its respective vapour source 20, 22, 28 and possibly 30-36 onto the heated substrate 14, whereupon the various elements are co-deposited. The elements react on the substrate 14 to form a thin film layer 38 of the crystalline lithium-containing transition metal oxide.

Then, a second thin film layer 40 is deposited. In the example of a battery, the second layer may be a layer of amorphous lithium-containing oxide or oxy-nitride intended as an electrolyte of the cell. To achieve this, the substrate 14 is heated to the same or a similar temperature (discussed further below) as was used to deposit the first layer 38, and a controlled flux of each component element in the lithium-containing oxide or oxy-nitride is released from its respective vapour source 20, 22, 24 and possibly 26 and/or 32-36 onto the heated substrate 14 whereupon the various elements are co-deposited. The elements react on the substrate to form a thin film layer 40 of the amorphous lithium-containing oxide or oxy-nitride, on top of the thin film layer 38 of the crystalline lithium-containing transition metal oxide.

According to some embodiments, the first and second layers may be deposited in other configurations and orders, for example the amorphous material first followed by the crystalline material second. The layers may be one on top of the other or side by side. Furthermore, other thin film layers may be added if desired. In the case of a battery, an anode layer may be deposited onto an electrolyte layer such as that described above. The method described above may be used to deposit a layer or layers in situ, if appropriate vapour sources of the required elements are included within the vacuum system 12. Alternatively, previously known deposition techniques might be employed. Also, previously deposited layers may already be present on the substrate 14 before the described crystalline and amorphous layers are deposited from the vapour sources.

Depending on the desired configuration of the thin film structure, it may be desirable to use one or more masks to define each layer while it is deposited. For convenience in handling, one may allow the substrate to cool after depositing a first layer so that a mask used for that layer can be exchanged for a mask needed for a second layer. In other embodiments, it may be preferred to maintain the substrate at the deposition temperature or in the deposition temperature range while the masks are changed; this can be faster and more efficient.

According to the invention, the reaction of the component elements to form the compounds of the two layers occurs on the surface of the substrate (or the surface of the previous layer) rather than in the vapour phase prior to deposition on the substrate. While not wishing to be bound by theory, it is believed that each component element in the vapour form collides with and adheres to the surface of the heated substrate, where the atoms of each element are then mobile on the surface and so are able to react with each other to form the oxide or oxynitride compound.

Performing the process in a vacuum ensures that the mean free path of the vapour phase particles (mean distance traveled before collision with another particle) travelling in the vacuum from their respective sources is long so that the chance of collisions between particles prior to deposition on the substrate is minimised. Advantageously, therefore, the distance from the sources to the substrate is arranged to be less than the mean free path to increase the chance of the particles reaching the substrate without colliding, thereby avoiding vapour phase interactions. Reaction of the component elements is hence limited to the heated substrate surface and the quality of the thin film compound material is enhanced.

An advantage of the invention is that deposition of the constituents of each compound directly from the elements allows for direct control of the compound composition via the rates of deposition of the component elements. The flux of each element can be independently controlled by appropriate operation of its respective vapour source so that the chemical composition of the deposited compound can be tailored according to exacting requirements if desired. Direct control of the stoichiometry of the deposited compound is therefore possible by controlling the flux, and hence consequently the rate of deposition, of each component element. Conventional deposition techniques such as sputtering and pulsed laser deposition can suffer from preferential loss of lighter elements so control of the proportion of the elements in the final compound is more difficult.

Also, deposition directly from the component elements eliminates the need for sputtering targets or precursors, and additional elements can be incorporated directly with no requirement to prepare new deposition targets. Further, it enables the deposition of smooth dense films with undamaged surfaces. Vapour sources such as those exemplified above produce lower energy particles than those produced by sputtering; this lower energy prevents cluster formation and reduces surface roughness of the deposited thin film, which is also a problem with pulsed laser deposition.

Importantly, the invention allows the direct deposition of crystalline lithium-rich transition metal oxides. The crystalline character makes the compounds suitable for use as electrodes, particularly cathodes, in thin film batteries. Under conventional synthetic conditions for both bulk and thin film samples, a post-deposition annealing step is typically needed to crystallise the material, which both complicates the process and is incompatible with any already-deposited material which needs to remain amorphous. The present invention is thus beneficial in offering a technique for making lithium-based thin film cathodes. Additionally, the invention further allows the formation of amorphous lithium-rich compounds under the same conditions as the crystalline lithium-containing transition metal oxides. The amorphous nature makes the compounds suitable for use as electrolytes in thin film batteries. Under conventional synthetic conditions for both bulk and thin film samples, these compounds are known to crystallise which impairs their performance as electrolytes. The present invention is thus beneficial in offering a technique for making lithium-based thin film electrolytes. Formation of both crystalline cathode materials and amorphous electrolyte materials under the same conditions and from some of the same element sources offers a highly attractive technique for simplifying and improving the fabrication of layered thin film structures such as batteries. The two layers can be deposited sequentially within the same apparatus with no additional process steps needed for those components.

An important feature of the invention is the heating of the substrate, and the fact that two different layers (crystalline and amorphous) can be directly deposited one after the other at the same or similar substrate temperature. Not only does this simplify the process for depositing the layers, but problems relating to heating can be eliminated since there is no need to anneal the cathode material to produce crystallisation while avoiding heating of electrolyte material to retain its amorphous character.

Prior work by the inventors (WO 2013/011326, WO 2013/011327) showing the synthesis of amorphous phosphorous-containing thin film materials by direct deposition of the constituent elements onto a substrate at room temperature suggested that the technique might be possible for other materials, for example lithium-rich glasses. A candidate of interest was lithium borosilicate, owing to its suitability as an electrolyte when in amorphous form. However, use of the method known for phosphates with the component elements of lithium borosilicate failed to produce the desired thin film. Under the conditions described in WO 2013/011326 and WO 2013/011327, the component elements do not react on the substrate in the expected manner and the required compound is not created. An unsatisfactory solution was found by replacing atomic oxygen with molecular oxygen; although this produced the desired amorphous lithium borosilicate at room temperature, the amorphous material will crystallise at the higher temperatures used in other battery manufacturing and processing steps, or if the battery is used at high temperature. There is also the risk of cracking of the deposited film during subsequent temperature cycling. Samples deposited at elevated temperature in the presence of molecular oxygen failed to form in the required phase. Also, materials intended as cathodes were produced as amorphous materials only, and a separate annealing step at temperatures in the range 350° C. to 750° C. was required to produce crystalline cathode materials.

The change of state from amorphous to crystalline at high temperatures is well-known, and deliberately employed in the process of annealing to make crystalline materials by heating amorphous materials. Hence, it is conventionally understood that high temperatures should be avoided in environments where a material needs to retain an amorphous character.

Consequently, it is a surprising and unexpected result that samples of amorphous lithium-containing oxides and oxynitrides can be successfully fabricated by depositing vapour phase component elements directly onto a substrate which has been heated. One would expect the heating to cause the deposited compound to be at least partially crystalline, but according to the present invention this is not the case. Heating of the substrate to about 180° C. or above when one or more of the component elements is a glass-forming element has been found to create the necessary conditions for the component elements to successfully react on the substrate surface to form the compound, but does not cause the compound to crystallise. Stable, good quality amorphous compounds with useful properties are formed.

When crystalline materials are required and annealing is applied to amorphous materials according to conventional techniques, very high temperatures are typically used, and the additional separate step adds complexity to the fabrication of crystalline materials. As an alternative, crystallisation can sometimes be encouraged by heating the substrate during deposition, but again, very high temperatures are employed. For example, crystalline $LiNi_{0.5}Mn_{1.5}O_4$ (LMNO) thin films have been deposited using PLD at substrate temperatures between 550° C. and 750° C., but a subsequent anneal for one hour at the same temperature was still required (Wang et al. Electrochimica Acta 102 (2013) 416-422).

Therefore, it is further surprising that samples of crystalline lithium-containing transition metal oxides can be successfully fabricated by depositing vapour phase component elements directly onto a moderately heated substrate. "Moderate" in this context is defined as a temperature range of between about 150° C. and 350° C. These temperatures are much lower than the temperatures conventionally used to produce sufficient quality crystallisation by annealing, and also much lower than substrate temperatures reported to date which have been used to encourage crystallisation during deposition by other techniques. Providing component elements including lithium, oxygen and one or more transition metals and heating the substrate to between about 150° C. and 350° C. has been found to create the necessary conditions for the component elements to successfully react on the substrate surface to form the compound directly in the crystalline form. Stable, good quality crystalline compounds with useful properties are formed.

So, we have two unexpected results: the production of amorphous materials at higher than expected temperatures, and the production of crystalline materials at lower than expected temperatures. While these results are important in their own right, a particular benefit is that the temperature ranges for the two materials coincide and overlap. Thus, the attractive arrangement of depositing a layer of crystalline material and a layer of amorphous material directly onto the same substrate during the same fabrication procedure and using the same apparatus, while avoiding the high temperatures that have a detrimental effect on both layered thin film structures and amorphous materials, is made available.

Experimental Results

We will now present a range of experimental results that demonstrate the successful fabrication of crystalline and amorphous materials using the described method of deposition directly from vapour sources of the component elements onto a heated substrate. Examples of various materials alone are given, to show that the properties desired for successful use as cathodes and electrolytes can be achieved, plus examples of layers of the materials deposited into battery structures from which measurements showing successful battery operation are obtained.

Amorphous Materials

Lithium Borosilicate

Consider lithium borosilicate ($Li_4SiO_4.Li_3BO_3$) as an example lithium-containing oxide compound which, in amorphous form, provides a good electrolyte material. In accordance with embodiments of the invention, this material is formed from the component elements lithium, oxygen and two glass-forming elements, boron and silicon. Several samples of lithium borosilicate were fabricated at a range of substrate temperatures using vapour deposition of these component elements in line with the embodiments described above, and characterized using Raman spectroscopy to determine their structure and properties. The depositions were carried out in a physical vapour deposition (PVD) system which has been previously described in the literature (Guerin, S. and Hayden, B. E., *Journal of Combinatorial Chemistry* 8, 2006, pages 66-73). Excluding the substrate temperature, all samples were deposited under identical conditions, utilizing an oxygen plasma source as a source of atomic oxygen. The oxide materials, lithium silicate and lithium borate, require the highest oxidation states of both silicon and boron (4+ and 3+ respectively), and the use of atomic oxygen rather than molecular oxygen therefore removes the dissociation step required to break $O_2$ to 2O and provides a highly reactive species to oxidize silicon and boron into their highest oxidation states, as required in the materials $Li_4SiO_4$ and $Li_3BO_3$. Lithium was deposited from a Knudsen cell source. Silicon and boron were both deposited from electron gun (E-Gun) sources.

Initial work was carried out without heating (room temperature, giving a substrate temperature of 29° C.) because the amorphous state was the desired form of the material and the expectation was that heating would produce crystallization of the material, resulting in a deterioration of the ionic conductivity. The deposition carried out using even the highest flow of atomic oxygen at room temperature did not result in the material of interest, however. A lack of the required chemical reaction meant that no lithium borosilicate was formed on the substrate.

Surprisingly, it was then found that amorphous lithium borosilicate was formed when the substrate was heated during deposition, resulting in a material with the required structure and exhibiting a high ionic conductivity suitable for use as an electrolyte. The effect of different substrate temperatures during deposition was then investigated. The measurement of Raman spectra enabled the monitoring of the silicate and borate moieties as a function of deposition temperature, allowing the composition of the thin film to be determined.

Table 1 summarizes the results of these studies, in which the lithium borosilicate is considered as a Li—B—Si—O ternary system. No B—O or Si—O bonds were observed within samples deposited at temperatures between 29° C. and 150° C., indicating that no lithium borosilicate was formed. Materials deposited between 200° C. and 275° C. were noted to exhibit the desired silicate and borate moieties (Si—O and B—O). A minor change in composition (proportion of the various component elements: lithium, oxygen, boron and silicon) was observed at 275° C. due to loss of lithium at this elevated temperature.

TABLE 1

| Temperature/° C. | Composition | B—O | Si—O |
|---|---|---|---|
| 29 | — | Not observed | Not observed |
| 50-150 | No change | Not observed | Not observed |
| 150 | No change | Not observed | Not observed |
| 200 | No change | Pyro-borate, ortho-borate, borate ring | $Si_2O_7^{6-}$ dimer, $SiO_3^-$ chain, $Si_2O_5^{2-}$ sheet |
| 225 | No change | Pyro-borate, ortho-borate, borate ring | $Si_2O_7^{6-}$ dimer, $SiO_3^-$ chain, $Si_2O_5^{2-}$ sheet |
| 275 | Minor loss of Li (<5 at. %) | Pyro-borate, ortho-borate, borate ring | $Si_2O_7^{6-}$ dimer, $SiO_3^-$ chain, $Si_2O_5^{2-}$ sheet |

The results of Table 1 demonstrate that a substrate temperature of 150° C. or below fails to produce a lithium borosilicate thin film, whereas a substrate temperature of 200° C. or above enables the formation of lithium borosilicate, when using an oxygen plasma source. From these and other measurements, the inventors have concluded that heating the substrate to a temperature of about 180° C. or above is sufficient to enable the required chemical reaction to occur on the substrate surface so that the desired amorphous compound is formed. Regarding an upper temperature limit, without adjusting the sources in this example it would not be desirable to increase the substrate temperature above about 275° C. due to the loss of lithium. However, because of the use of separate sources for the metallic elements the rate of the lithium source could be increased to allow for deposition of material with the correct composition at temperatures higher than 275° C. The upper limit on temperature is the temperature at which crystallisation, and a concurrent decrease in ionic conductivity, would occur. A substrate temperature up to about 350° C. would be viable, since this will avoid crystallisation while still enabling compensation for lithium loss by source adjustment. The temperature range of 180° C. to 350° C. is expected to be applicable to all lithium-containing and glass-forming element containing oxide and oxynitride compounds, so that the present invention provides a reliable and simple way to produce amorphous samples of these materials. However, crystalline lithium-containing metal oxide compounds can be successfully deposited at temperatures in the lower parts of this range (as discussed further below), so when fabricating a thin film battery the higher temperatures can be avoided if desired.

Figure 2:
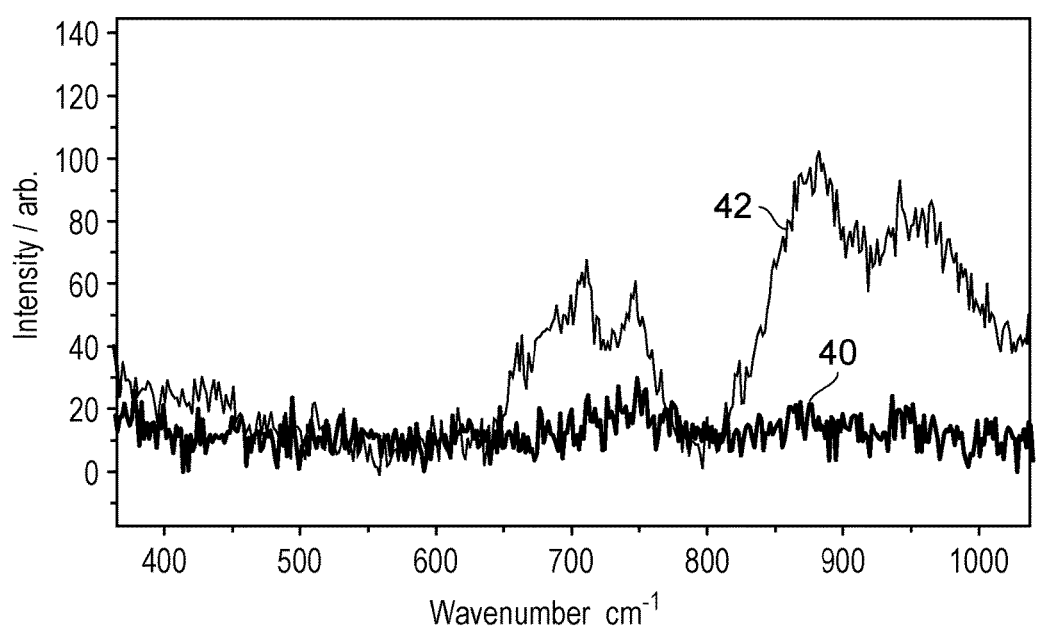
FIG. 2 shows Raman spectra of samples of material deposited according to a prior art method and a method in accordance with an embodiment of the invention.

FIG. 2 shows the Raman spectra of $Li_{0.78}B_{0.11}Si_{0.11}$ (±1 at. %) deposited at room temperature (29° C.) and at 225° C., plotted as intensity against wavenumber. Line 40 shows the spectrum at 29° C. and line 42 shows the spectrum at 225° C. From these, it can be seen that the material deposited at room temperature does not contain the moieties of interest (no bands are observed in the region of interest). The material deposited at 225° C. exhibits bands which can be assigned to both the borate and silicate moieties of interest.

In addition, impedance measurements were carried out on the materials deposited at 29° C. and at 225° C. It was not possible to determine the ionic conductivity of the materials deposited at 29° C., since the material showed no ionic conductivity. This is consistent with the negligible formation of silicate and borate moieties. In contrast the material deposited at 225° C. exhibited a clear ionic conduction process, with a conductivity value of $2 \times 10^{-6}$ S cm$^{-1}$. The observation of this level of conductivity confirms both that the material of interest, lithium borosilicate, has been produced at elevated temperature and that crystallization has not occurred due to the heating of the material during deposition. If the material had de-vitrified the ionic conductivity would be reduced by several orders of magnitude. X-ray diffraction of this material confirmed that crystallization had not occurred.

Thus, the unexpected result is obtained that an amorphous thin film of a lithium-containing oxide compound can be formed on a heated substrate.

Further Characterisation of Amorphous Lithium Borosilicate

As described, lithium borosilicate thin films were prepared at elevated temperatures, including 225° C. Contrary to expectations based on the understanding that heating causes crystallisation, these thin films were observed to be amorphous.

Figure 3:
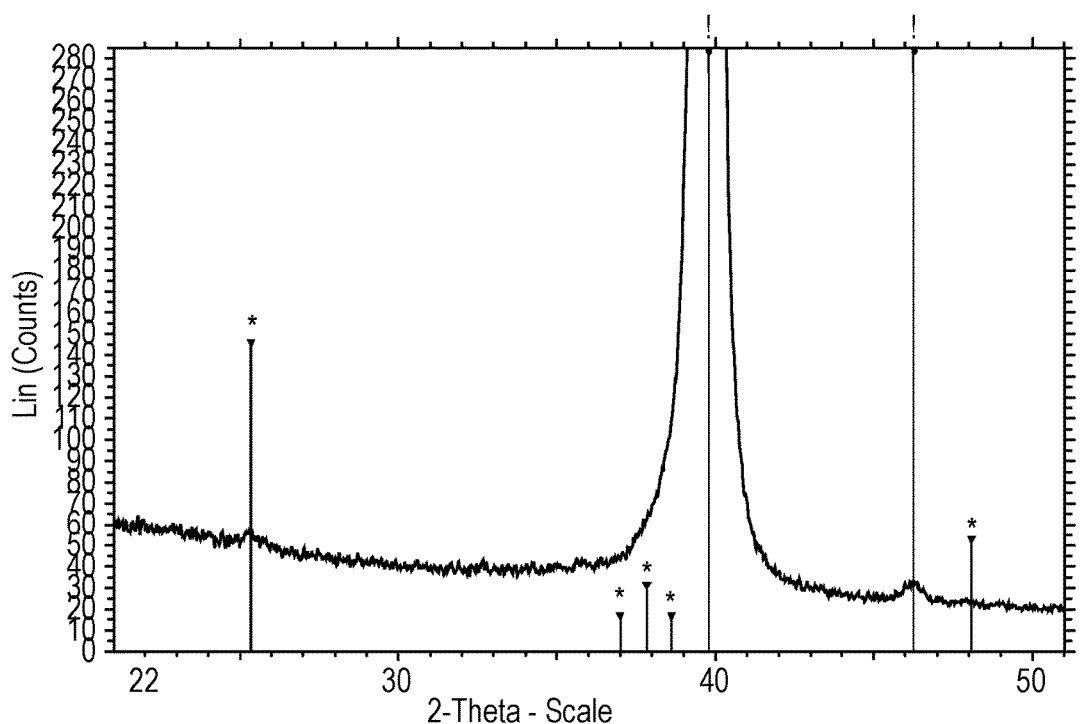
FIG. 3 shows an X-ray diffraction measurement of a sample of lithium borosilicate deposited in accordance with an embodiment of the invention.

FIG. 3 shows the results of X-ray diffraction measurements performed to investigate the crystal structure of the lithium borosilicate. As can be seen, the X-ray diffraction plot shows no clear peaks arising from lithium borosilicate. Rather, the peaks shown are attributable to the materials in the $Si/SiO_2/TiO_2/Pt$ substrate supporting the lithium borosilicate thin film. FIG. 3 includes reference patterns for Pt and $TiO_2$ (marked respectively with "!" and "*"), indicating that the observed peaks arise from the substrate rather than the thin film. The absence of any peaks attributable to lithium borosilicate indicates that the deposited material is amorphous.

To further test the lithium borosilicate samples, impedance measurements were carried out at room temperature to determine ionic conductivity.

Figure 4:
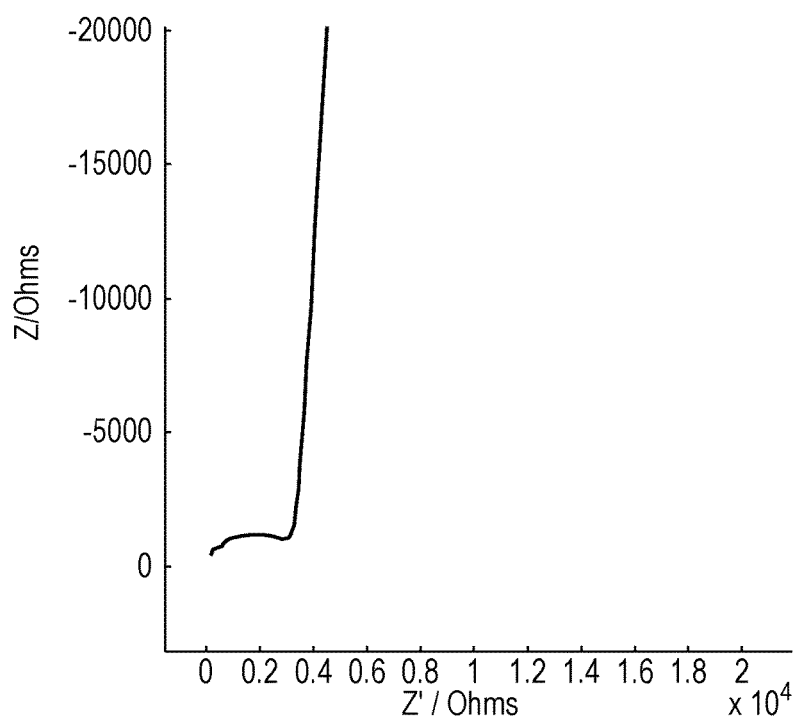
FIG. 4 shows an impedance spectrum of a sample of lithium borosilicate deposited in accordance with an embodiment of the invention.

FIG. 4 shows the results of the impedance measurements, as an impedance spectrum of a sample of lithium borosilicate deposited at a substrate temperature of 225° C. The chemical composition of this film was $Li_{0.77}B_{0.18}Si_{0.05}$. From these measurements, the ionic conductivity was determined to be $3.2 \times 10^{-6}$ S cm$^{-1}$. This makes the material suitable for use as an electrolyte in a lithium ion battery, and is comparable to the ionic conductivity of the current most commonly used thin film electrolyte material, LiPON ($3 \times 10^{-6}$ S cm$^{-1}$).

Nitrogen-Doped Lithium Borosilicate

The above-described fabrication of lithium borosilicate was modified to demonstrate its flexibility and applicability to the production of other lithium-containing oxide and oxynitride compounds. Nitrogen-doped lithium borosilicate was produced by introducing nitrogen into the gas feed to the oxygen plasma source, to deliver a mixed oxygen-nitrogen flux. The lithium, boron and silicon were provided as previously described, and the temperature of the substrate was 225° C. A range of substrate temperatures similar to that demonstrated for undoped lithium borosilicate is also applicable to the nitrogen-doped materials, i.e. about 180° C. to about 350° C., with the narrower range of about 180° C. to about 275° C. likely to produce quality material in a simple way, for example without the need to adjust for lithium loss.

Figure 5:
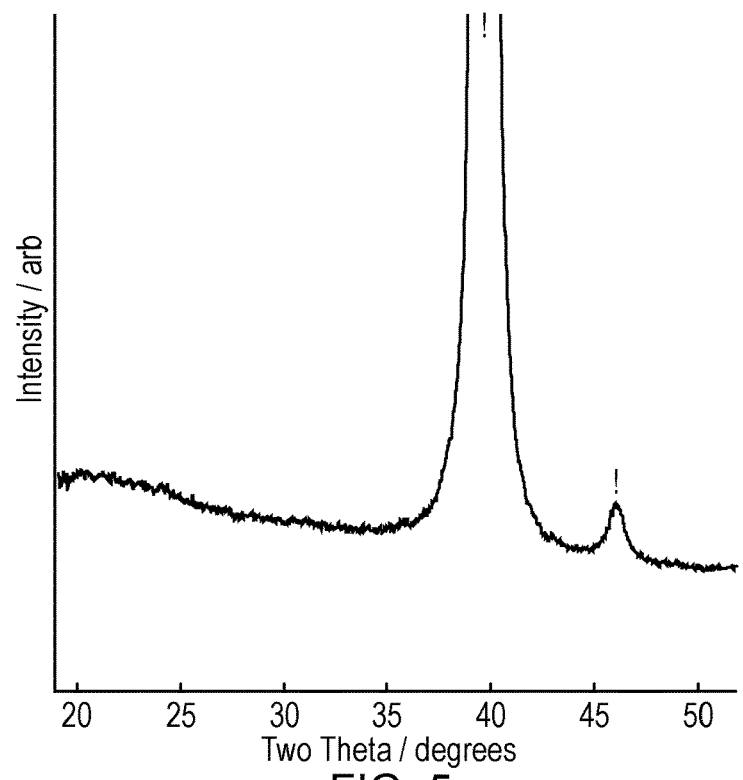
FIG. 5 shows an X-ray diffraction measurement of a sample of nitrogen-doped lithium borosilicate deposited in accordance with an embodiment of the invention.

FIG. 5 shows a measured X-ray diffraction plot of the resulting nitrogen-doped lithium borosilicate thin film. The peaks on the graph (marked with a "!") are attributable to platinum in the AlOPt substrate. The absence of other peaks indicates that the sample was amorphous and lacking in crystalline structure.

Figure 6:
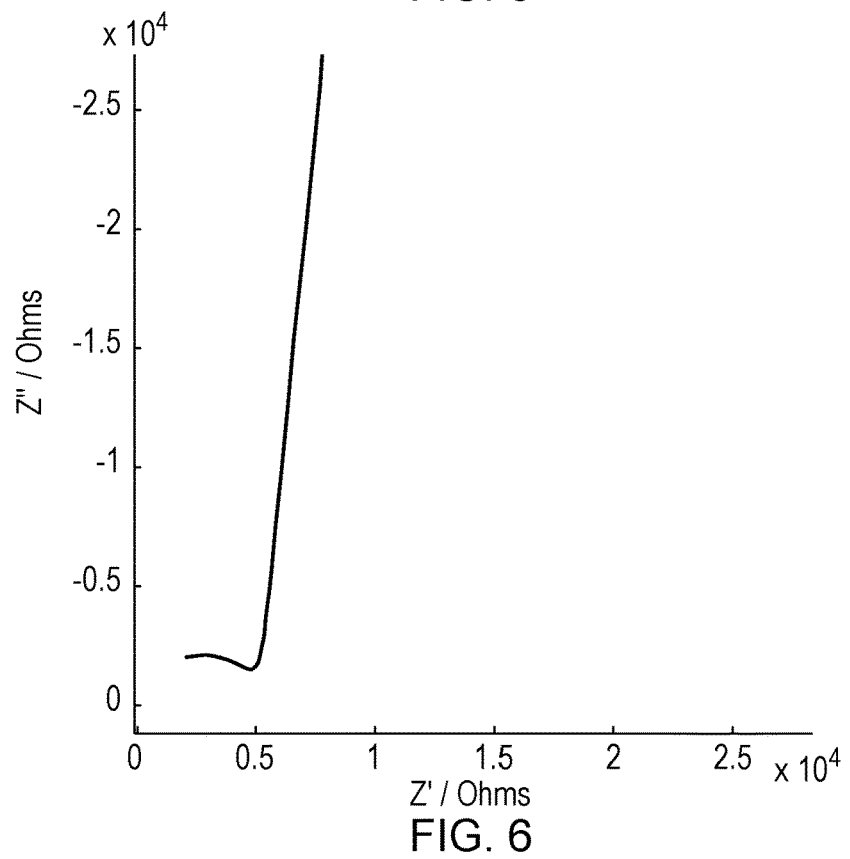
FIG. 6 shows an impedance spectrum of a sample of nitrogen-doped lithium borosilicate deposited in accordance with an embodiment of the invention.

FIG. 6 shows an impedance spectrum of the nitrogen-doped lithium borosilicate thin film, which had a composition of $Li_{0.78}B_{0.06}Si_{0.16}$. From this measurement, the ionic conductivity is determined to be $7.76 \times 10^{-6}$ S cm$^{-1}$. These results demonstrate the flexibility of this process, which easily enables the successful doping of amorphous lithium borosilicate with nitrogen. The doping demonstrates a clear improvement in the ionic conductivity of the compound from $3.2 \times 10^{-6}$ S cm$^{-1}$ to $7.76 \times 10^{-6}$ S cm$^{-1}$. This improves the performance of the material significantly beyond that shown previously for the electrolyte material LiPON and therefore provides a simple and effective means to enhance the performance of a solid state battery.

Crystalline Materials

As examples, crystalline lithium manganese oxide and crystalline lithium manganese nickel oxide thin films have been fabricated by deposition directly from the elements onto heated substrates, as described above.

Unless otherwise stated the depositions were carried out within an ultra-high vacuum (UHV) system using the arrangement described in Guerin, S; Hayden, B. E., *J. Comb. Chem.*, 2006, 8, 66 and WO 2005/035820. The films were deposited onto sapphire substrates coated with $TiO_2$ (10 nm) and platinum (100 nm) (AlOPt, from Mir Enterprises).

Lithium manganese oxide and lithium manganese nickel oxide (LMO and LMNO respectively) thin films intended as cathodes were synthesised from lithium, manganese, nickel and oxygen sources. Manganese and lithium were deposited from Knudsen cells. Nickel was deposited from an electron beam evaporator and oxygen was provided by a plasma atom source.

A range of samples of LMO were deposited at substrate temperatures between 25° C. and 450° C. By modifying the substrate temperature utilised, the threshold for crystallisation could be determined, and crystallisation of the resultant material was enhanced as the temperature was raised.

Figure 7:
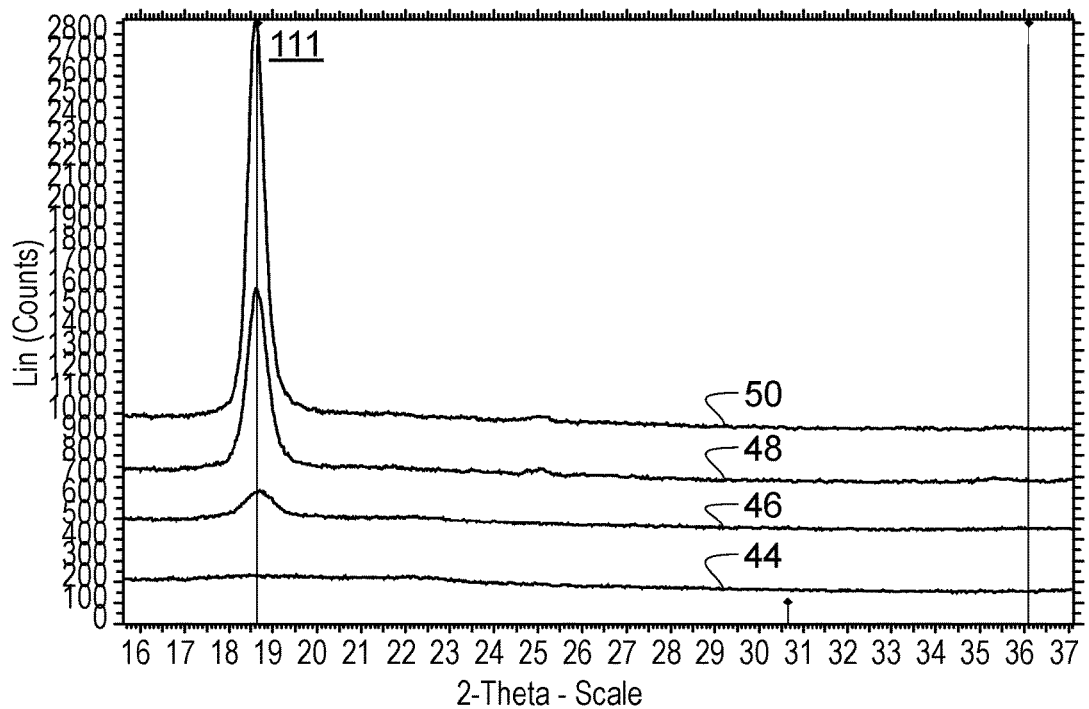
FIG. 7 shows X-ray diffraction measurements of samples of lithium manganese oxide deposited in accordance with embodiments of the invention.

FIG. 7 shows the results of X-ray diffraction measurements of samples of LMO deposited at different temperatures. Line 44 represents LMO deposited at room temperature (25° C.), which exhibits no clear peaks in the diffraction patterns. This is consistent with an amorphous material, as expected at for deposition at room temperature. Increasing the substrate temperature to 150° C. (line 46) causes crystallization to occur, which can be seen from the fact that the diffraction pattern recorded for this sample exhibits a small peak at ca. 18.6°, consistent with the 111 reflection of $LiMn_2O_4$ (00-035-0782). The observation of crystallization by X-ray diffraction at a substrate temperature of only 150° C. is surprising given the prior art which indicates that deposition of thin films of LMO at temperatures below 200° C. results in X-ray amorphous materials (Jayanth et al. Appl Nanosci (2012) 2:401-407). Increasing the substrate temperature further to 250° C. (line 48) is noted to further enhance crystallisation, as exhibited by the enhanced peak intensity of the 111 reflection. LMO deposited at 350° C. (line 50) exhibits a further enhancement in the peak intensity at the angle.

Determining the full width at half maximum (FWHM) for these peaks provides further insight into the improved crystallisation. As crystallites grow the FWHM reduces due to the larger crystallites providing enhanced ordering. LMO deposited at 150° C. exhibits a FWHM of 0.882°. This can be translated by the Scherrer equation into an approximate crystallite size, which in this case is approximately 9 nm. Increasing the deposition temperature to 250° C. causes a reduction in the FWHM to 0.583° and a concomitant increase in the crystallite size to 14 nm. A further increase in temperature to 350° C. results in a FWHM of 0.471° and a crystallite size of 17 nm.

Hence, good quality structured crystalline material is achieved at these modest substrate temperatures. This represents a great improvement over known techniques, both by removing the need for post-annealing, and by reducing the manufacturing temperature compared to that needed for annealing.

Lithium manganese nickel oxide (LMNO) samples were prepared under various conditions using the previously detailed technique. Again, crystalline material was successfully deposited directly at only modest substrate temperatures. By modifying the substrate temperature utilised, the crystallisation of the resultant material can be enhanced.

Figure 8:
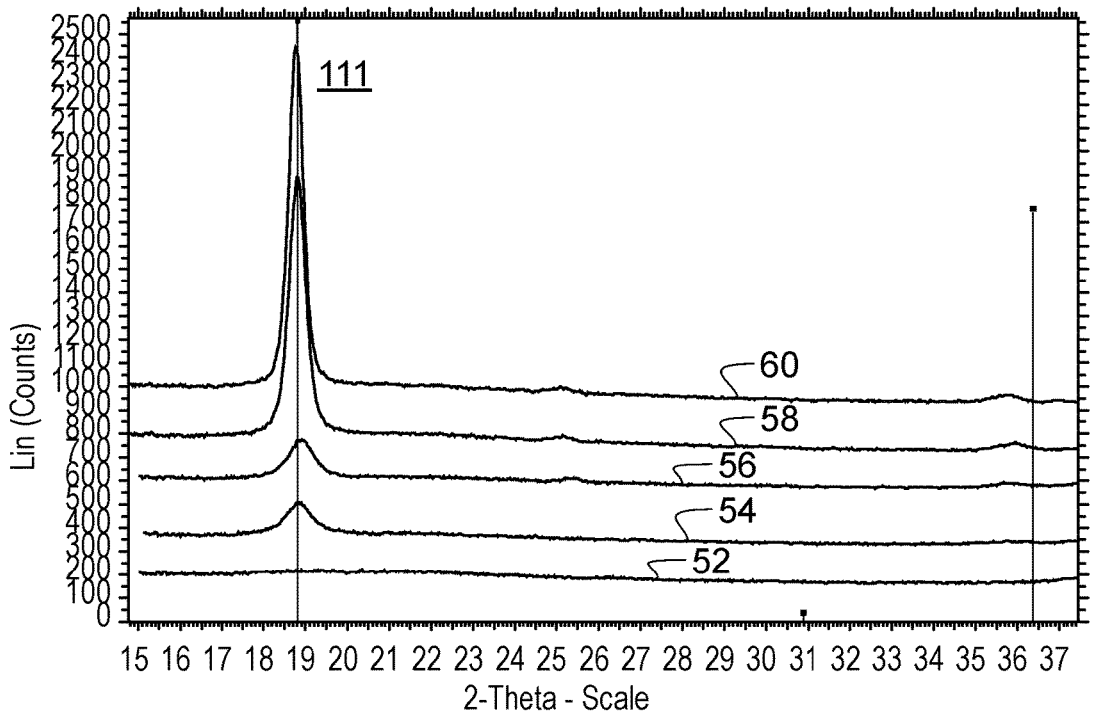
FIG. 8 shows X-ray diffraction measurements of samples of lithium manganese nickel oxide deposited in accordance with embodiments of the invention.

FIG. 8 shows the results of X-ray diffraction measurements of samples of LMNO deposited at different temperatures. Material deposited at room temperature (25° C.), shown by line 52, exhibits no clear peaks in the diffraction patterns, consistent with the amorphous material expected at this temperature. Increasing the temperature to 150° C. (line 54) enhances the crystallisation, and diffraction patterns recorded for this sample exhibits a small peak at ca. 18.6°, consistent with the 111 reflection of $LiMn_{1.5}Ni_{0.5}O_4$ (04-015-5905). Increasing the substrate temperature further to 250° C. (line 56) is noted to further enhance crystallisation, as exhibited by the larger peak intensity of the 111 reflection. Material deposited at 350° C. (line 58) exhibits a further enhancement in the peak intensity at the angle, and LMNO deposited at 450° C. (line 60) exhibits an additional enhancement in the peak intensity at the angle.

Determining the full width at half maximum (FWHM) for these peaks provides further insight into the improved crystallisation. As crystallites grow the FWHM reduces due to the larger crystallites providing enhanced ordering. LMNO deposited at 150° C. exhibits a FWHM of 0.841°. This can be translated by the Scherrer equation into an approximate crystallite size, which in this case is approximately 10 nm. Increasing the deposition temperature to 250° C. causes a slight reduction in the FWHM to 0.805° resulting in a crystallite size of approximately 10 nm. Further increases in temperature to 350° C. results in a FWHM of 0.511° and a crystallite size of 16 nm. Depositions carried out at 450° C. exhibit a FWHM of 0.447° and a crystallite size of 18 nm.

So, as for LMO, good quality structured crystalline LMNO can be achieved with these moderate temperature substrates. Indeed, the X-ray diffraction measurements of LMNO clearly demonstrate that it is possible to deposit crystalline LMNO at moderate temperatures significantly lower than those previously demonstrated without any need to post anneal, or apply energy for a secondary source such as an ion source. As a comparison it has been previously shown that the annealing processes required to produce crystalline LMNO with sol-gel samples requires three anneals at 750° C. and a further anneal at 800° C. (Zhong, Q., et al., J. Electrochem. Soc., (1997), 144(1), 205-213).

Surface Characterisation of the Crystalline LMO and LMNO

The surface morphology of LMO and LMNO samples deposited according to embodiments of the present invention has been compared with those deposited by alternative methods, to determine any improvements.

Figure 9:
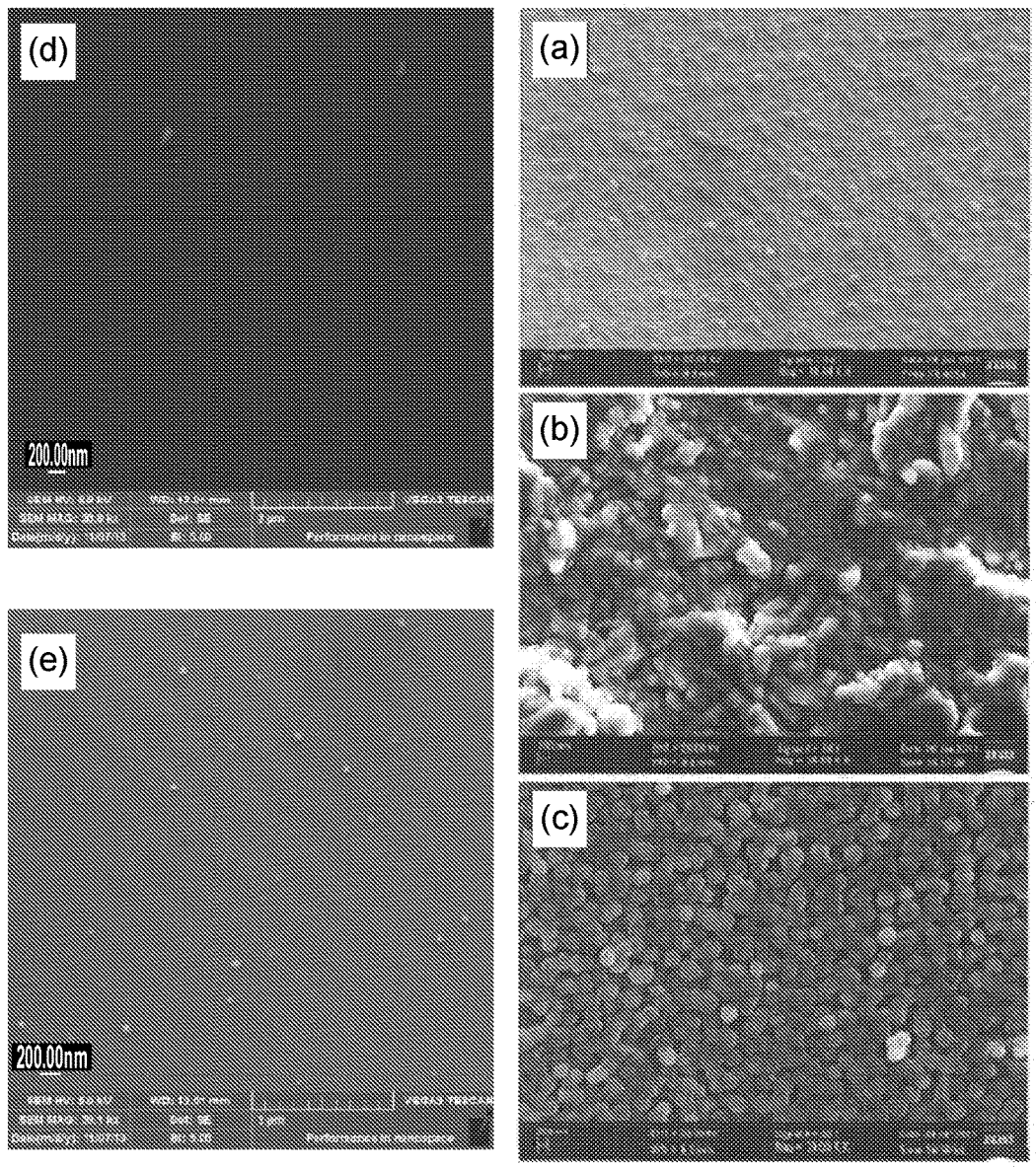
FIG. 9 shows scanning electron microscope images of the surface of samples of lithium manganese oxide deposited in accordance with an embodiment of the invention compared with images of the surfaces of samples prepared by a prior art method.

FIGS. 9(a)-9(e) show some of the results, in the form of scanning electron microscope (SEM) images at 30 Kx magnification. FIGS. 9(e) and 9(d) show LMO thin films deposited according to the invention at substrate temperatures of 225° C. and 350° C. respectively, while FIGS. 4(a), 4(b) and 4(c) show LMO films deposited using RF sputtering at substrate temperatures of 200° C., 300° C. and 400° C. respectively (Jayanth et al. Appl Nanosci (2012) 2:401-407). Note that LMO deposited according to the invention at both 225° C. and 350° C. exhibits significantly reduced roughness compared to that deposited by RF sputtering at 200° C. and 300° C. Only a very small number of features of around 100 nm in diameter are observed on a LMO film deposited according to the invention at 350° C., and still fewer on the film deposited at 225° C. These samples are significantly smoother than the films deposited by sputtering; for example the film deposited at 300° C. can be observed to have features with diameters of the order of 1 µm. The features observed on sputtered films are generally an order of magnitude larger than the ones observed on films deposited according to embodiments of the invention, and this will make a significant difference when these thin films are assembled into devices. For example, this enhanced film quality is critical when depositing multiple thin layers of films on top of one another. If one were to use LMO as a cathode within a solid state battery it would be necessary to deposit a suitably thick layer of solid electrolyte onto the LMO to prevent direct contact between the LMO and the overlying anode caused by surface protrusions extending into and through the electrolyte. An increased smoothness of the LMO layer as can be achieved by use of the present invention will enable a thinner layer of electrolyte to be used, which results in a more efficient solid state battery and cheaper and more efficient manufacture of that battery.

FIGS. 10(a) and 10(b) show comparative SEM images of LMNO samples. FIG. 10(a) shows LMNO deposited according to the invention at 350° C., and FIG. 10(b) shows LMNO deposited by magnetron sputtering with a post anneal at 700° C. in air (upper image) and 750° in air (lower image) (Baggetto et al., J. Power Sources, (2012), 211, 108-118). As can be seen from these images, the sample fabricated according to the invention exhibits a significantly smoother denser film surface than those of the prior art deposited by sputtering with a post-anneal.

Demonstrations of Functioning Batteries

The amorphous nature of the undoped and doped lithium borosilicate and the accompanying high ionic conductivities indicate that these thin films are well-suited for use as the electrolyte in a thin film battery. Similarly, the crystalline LMO and LMNO are well-suited for use as the cathode. Therefore, various thin film half cells and batteries have been created using the described vapour deposition process and characterised to show full functionality.

Figure 11:
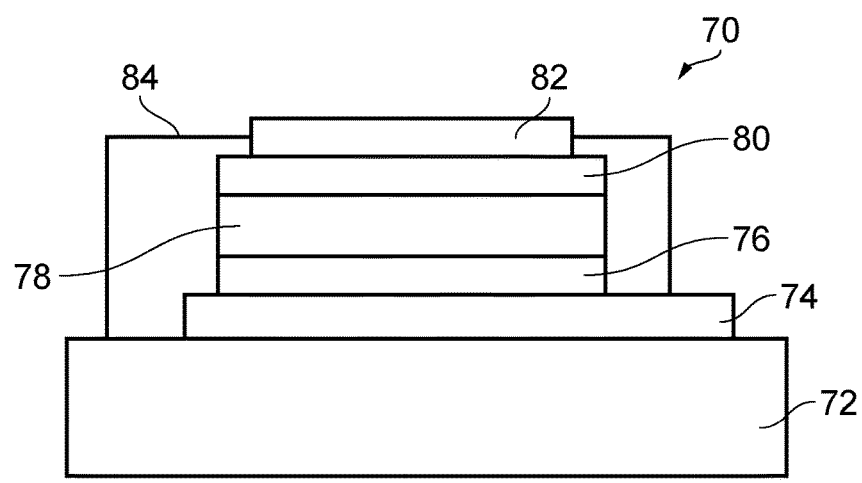
FIG. 11 shows a schematic cross-sectional view of an example thin film battery of conventional structure.

FIG. 11 shows a schematic cross-sectional view of an example lithium ion thin film battery or cell 70 of typical structure. Such batteries comprise a series of layers, typically formed by one or more deposition or other fabrication processes. The vapour deposition method of the present invention is advantageous for this, since good quality electrode and electrolyte materials can be deposited directly on a same or similar temperature substrate. In the example battery 70, a substrate 72 supports the various layers. In order starting from the substrate these are a cathode current collector 74, a cathode 76, a electrolyte 78, an anode 80 and an anode current collector 82. A protective encapsulation layer 84 is formed over the layers. In other examples, the layers may be arranged in the opposite order, with the exception of the encapsulation layer which, if included, will always be the last layer.

Experimental Battery Results: Lithium Borosilicate Electrolyte and Lithium Manganese Oxide Cathode Samples including cathode, electrolyte and anode layers were fabricated in experiments to demonstrate operating cells. In a first example, depositions of the three constituent films of the thin film battery (cathode, electrolyte and anode) were carried out within an ultra high vacuum system onto sapphire substrates coated with $TiO_2$ (10 nm) and Pt (100 nm) (AlOPt substrate, from Mir Enterprises). For the cathode, a thin film of lithium manganese oxide (LMO) was synthesised from lithium, manganese and oxygen sources. The manganese and lithium were deposited from Knudsen cells while the oxygen was provided by a plasma atom source. The deposition was carried out for 7620 seconds, giving a thin film of uniform thickness of 300 nm. The temperature of the substrate was held at 350° C. to provide a crystalline material, in accordance with embodiments of the invention. This is merely exemplary, however, and a crystalline LMO cathode layer could be deposited using alternative sources for the various component elements, and at other temperatures and for other times, as discussed above. At the end of the LMO deposition the lithium and manganese source shutters were closed to block the flux of these elements. The substrate was cooled from 350° C. to 225° C. over a period of 360 seconds, during which time exposure to the flux of atomic oxygen continued.

The electrolyte was a thin film of lithium borosilicate, also deposited in accordance with embodiments of the invention. It was synthesised using lithium, boron, silicon and oxygen sources. As for the cathode, the lithium was deposited from a Knudsen cell and the plasma source provided atomic oxygen. The boron and silicon were deposited from electron beam evaporators. The substrate was maintained at 225° C. during deposition of the electrolyte, which continued for 14400 seconds to give a thin film of thickness 800 nm. This process is merely exemplary, however, and an amorphous lithium borosilicate electrolyte layer could be deposited using alternative sources for the various component elements, and at other temperatures and for other times, as discussed above.

Following this, a physical mask was placed in front of the sample to define discrete batteries of 1×1 mm, without removing the sample from the vacuum. This took less than 600 seconds. Then, a tin oxide anode was deposited using a Knudsen cell tin source and the atomic oxygen plasma source, over the course of 180 seconds. The thickness of the resulting anode layer was estimated at 9.6 nm (based on calibration measurements). Finally, a 100 nm layer of nickel was added as a top current collector using an electron beam evaporator and a second mask with 1.5×15 mm apertures, again with the sample remaining in the vacuum. Thus, a LMO/LBSiO/SnO$_2$ thin film battery was produced.

X-ray diffraction measurements confirmed that the LMO cathode deposited at 350° C. was crystalline, and that the lithium borosilicate electrolyte deposited at 225° C. was amorphous, as expected according to the invention.

Note that although in this example each of the cathode, electrolyte and anode layers were fabricated using vapour deposition of the component elements onto a heated substrate, the anode layer could have been made by any convenient and appropriate thin film fabrication process, as preferred. Other anode materials could also be used, fabricated as desired. Also, the layers may be deposited in a different order, for example, anode first, then electrolyte, then cathode.

To test operation of the cell, contact was made via two pin probes within a glove box. Charge and discharge measurements were carried out using a constant current-constant voltage (CC/CV) instrument.

Figure 10:
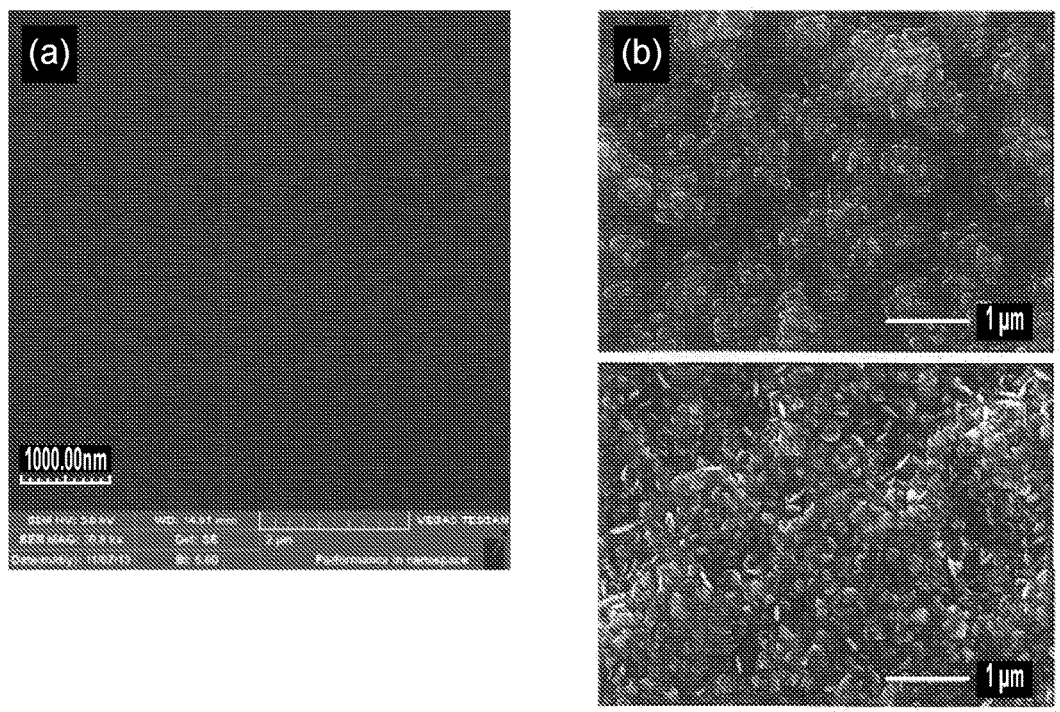
FIG. 10 shows scanning electron microscope images of the surface of samples of lithium manganese nickel oxide deposited in accordance with an embodiment of the invention compared with images of the surfaces of samples prepared by a prior art method.
Figure 12:
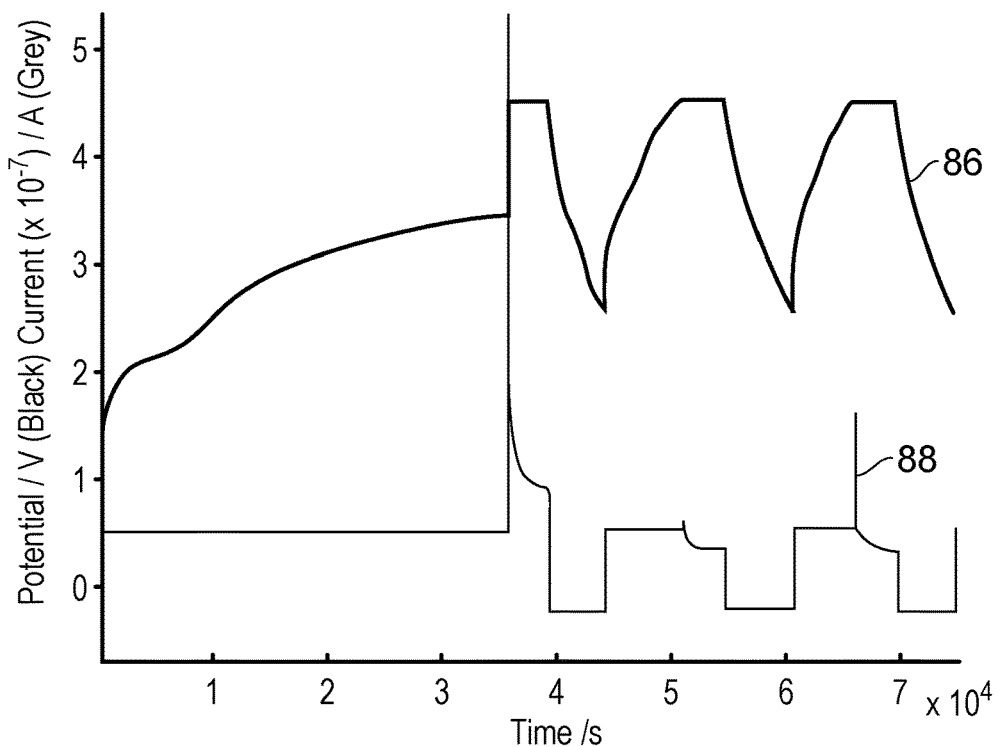
FIG. 12 shows a graph of voltage and current versus time for charge/discharge cycles of a thin film battery having a lithium borosilicate electrolyte and deposited by a method according to an embodiment of the invention.
Figure 13:
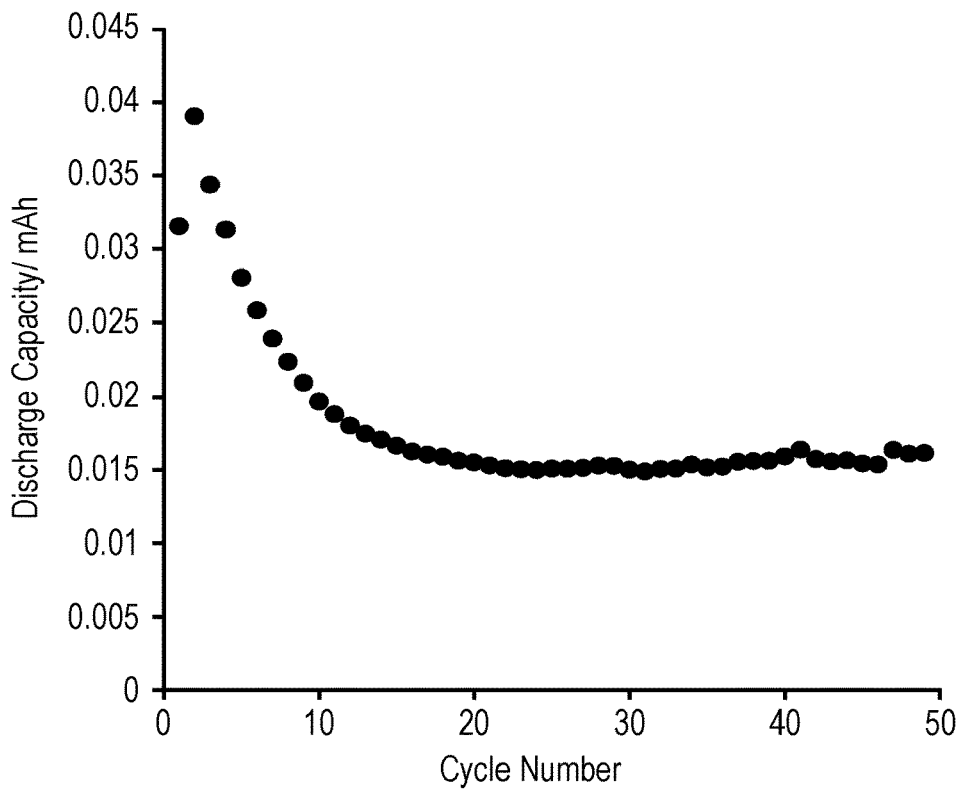
FIG. 13 shows a graph of measurements of the discharge capacity of the same battery.

FIGS. 12 and 13 show the results of these measurements. FIG. 8 shows a plot of voltage and current versus time for the first charge/discharge cycles. Curve 86 shows the cell potential, and curve 88 shows the current. FIG. 10 shows measurements of the discharge capacity over the first 50 cycles. The cell demonstrated a maximum in capacity over the first 10 cycles, with the capacity stabilising after 20 cycles. A maximum discharge capacity of 0.077 mA h was observed in cycle 2 (corresponding to 25.4 mA h cm$^{-2}$ μm$^{-1}$). This corresponds to 83% of the theoretical capacity, based on an anode limited system. Following 20 cycles the capacity was observed to drop to 0.015 mA h (4.9 mA h cm$^{-2}$ μm$^{-1}$) corresponding to 33% of the theoretical capacity, based on an anode limited system. The capacity was noted to stabilise at this level and following a further 29 cycles the capacity was observed to be 0.016 mA h.

It is believed that this is the first reported demonstration of a fully functioning thin film battery in which all of the cathode, electrolyte and anode layers were deposited as thin film layers directly from the component elements.

Experimental Battery Results: LMO Cathode Deposited at 225° C.

Cyclic voltammetry and constant current/constant voltage (CC/CV) measurements of LiMn$_2$O$_4$ thin films deposited at a substrate temperature of 225° C. and used in either liquid electrolyte half cells or solid state full cells demonstrated that the films produced according to embodiments of the invention are electrochemically active, with capacities comparable with those demonstrated in the literature.

To further test the capability of thin films deposited according to the invention to function in thin films cells, a half-cell of lithium manganese oxide (LMO) was created by co-depositing lithium, manganese and oxygen at the appropriate ratio from separate vapour sources, using a substrate temperature of 225° C. The conditions used were determined by depositing test samples, the composition of which was determined using laser ablation inductively coupled mass spectrometry (ICPMS) and the rates of the lithium and manganese sources were altered accordingly to obtain optimum conditions for deposition of the desired composition. LMO with a thickness of 300 nm was deposited onto a platinum pad over an area of 2.25 mm$^2$, and was assembled into a half cell with 1 M LiPF$_6$ in EC:DMC=1:1 as the electrolyte and lithium metal as the counter electrode.

Figure 14:
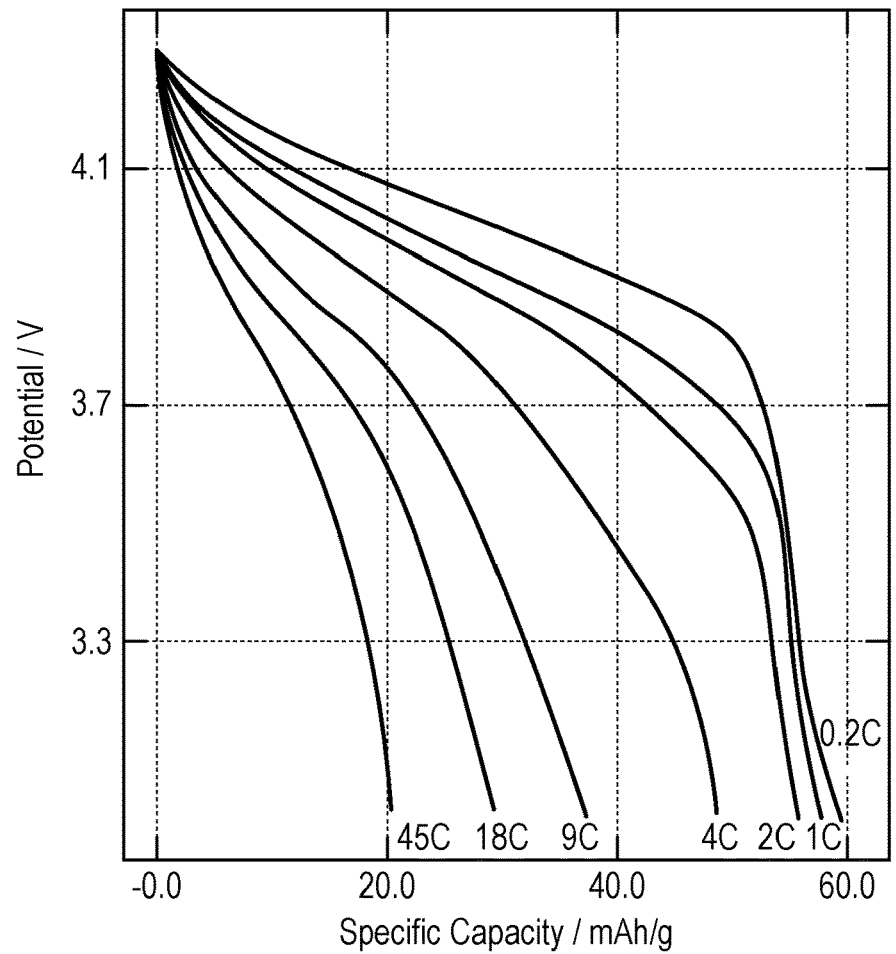
FIG. 14 shows discharge curves measured from samples of lithium manganese oxide in a half cell and deposited in accordance with an embodiment of the invention.

FIG. 14 shows discharge curves of the LMO thin films at various rates ranging from 0.1 to 25 mV/s (0.2 to 45 C) in the potential window between 4.3 and 3.0 V vs. Li/Li$^+$.

Figure 15:
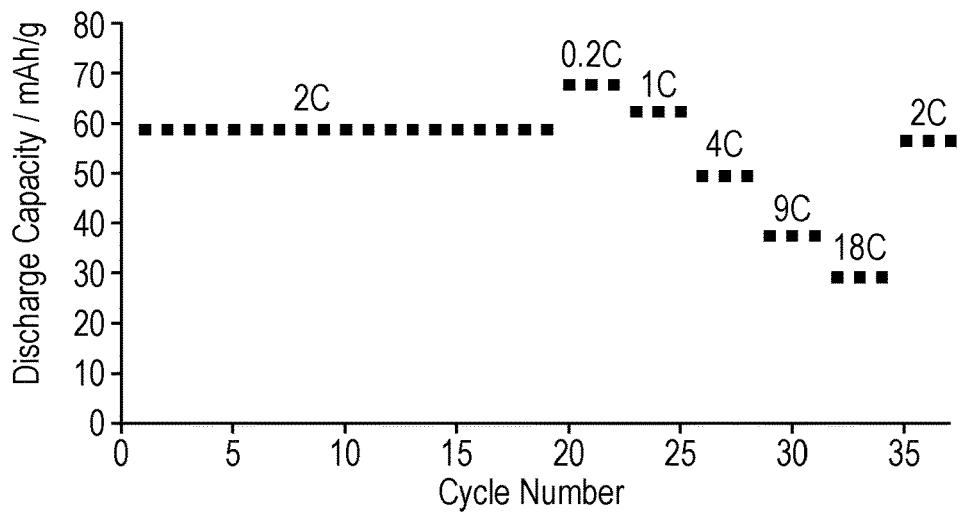
FIG. 15 shows capacity measurements taken from samples of lithium manganese oxide in a half cell and deposited in accordance with an embodiment of the invention, at various discharge rates.

FIG. 15 shows measured capacities of the LMO films discharged at various rates from 0.1 to 25 mV/s (0.2 to 45 C) in the potential window between 5.0 and 3.0 V vs. Li/Li$^+$.

From these measurements, we observe that the capacity of the LMO material has a discharge capacity of 60 mA h g$^{-1}$ or 29 μA h cm$^{-2}$ μm$^{-1}$ at a charge and discharge rate of 1 C. Charge and discharge times are expressed as C-rates where a 1 C-rate corresponds to a complete charge/discharge in 1 hour; an 'n' C-rate will charge/discharge a cell in 1/n hrs. Commonly, batteries are charged and discharged using fairly slow rates, and as the rate increases the accessible capacity decreases. In fact, "most commercial cells only use a few percent of their stored energy when charged at rates starting as low as 10 C" (Braun, P. V., Current Opinion in Solid State Materials Science, 16, 4 (2012), 186-198). These results are an improvement over LMO deposited at similar substrate temperatures using other methods. LMO thin films deposited by RF-sputtering at 200° C. have been shown to have a discharge capacity of 24 μAh cm$^{-2}$ μm$^{-1}$ (Jayanth et al. Appl Nanosci (2012) 2:401-407) and LMO deposited by PLD at 200° C. has been shown to have a discharge capacity of ~18 μAh cm$^{-2}$ μm$^{-1}$. (Tang et al. J. Solid State Chemistry 179 (2006) 3831-3838). An experiment was carried out to study the rate capability of the deposited LMO by cycling using cyclic voltammetry between potential limits of 3 and 5 V using sweep rates between 0.1 and 150 mV/s (equivalent to C rates between 0.2 and 270 C). The results are shown in Table 2, as a summary of capacities as a function of sweep rate for LiMn$_2$O$_4$ thin films at various rates ranging from 0.1 to 25 mV/s (0.2 to 45 C) in the potential window between 4.3 and 3.0 V vs. Li/Li$^+$.

TABLE 2

| Rate/mV/s (C) | Capacity/mA h/g | Percentage Capacity (cf. 0.2 C) |
| --- | --- | --- |
| 1 (1.8 C) | 57.7 | 85 |
| 0.1 (0.2 C) | 67.5 | 100 |
| 0.5 (1 C) | 61.8 | 92 |
| 2 (3.6 C) | 48.9 | 72 |
| 5 (9 C) | 36.7 | 54 |
| 10 (18 C) | 28.7 | 43 |
| 1 (1.8 C) | 56.1 | 83 |
| 25 (45 C) | 20.4 | 30 |
| 50 (90 C) | 17.3 | 26 |
| 100 (180 C) | 13.8 | 20 |
| 150 (270 C) | 12.0 | 18 |

Hence, LMO deposited by methods according to embodiments of the present invention demonstrates a good cycle ability and only moderate loss in capacity when cycled at increased rates, and exhibits negligible capacity loss over 35 cycles, as shown in FIG. 15. The mean capacity over cycles 1-19 was observed to be 58.73 mA h Following a further 15 cycles, at rates up to 45 C the capacity of the PVD LMO was observed to only drop to 56.84 mA h g$^{-1}$ (3.2% loss). When cycled at high rates (up to 270 C), LMO deposited by PVD exhibits only moderate losses in capacity; see Table 2. These losses are considerably less than those observed in LMO deposited by other means. For example, Chen et al (Thin Solid Films 544 (2013) 182-185) claim a high rate performance LMO. In this case the LMO exhibits at best only 22% of its initial capacity (at 0.2 C) when cycled at 45 C. In a direct comparison, LMO deposited by the current invention retains 30% of its capacity. Being able to access the capacity of the LMO at high rates means that the material is useful for applications requiring short bursts of high power.

These results from a half-cell indicate that a battery comprising an LMO cathode deposited with an amorphous electrolyte layer according to embodiments of the invention would provide good performance.

Figure 16:
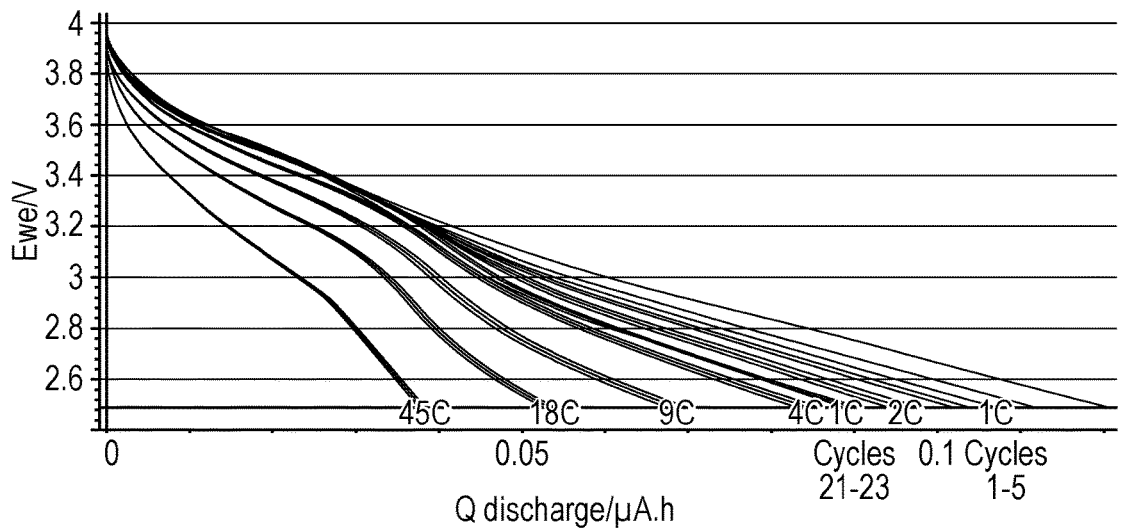
FIG. 16 shows discharge curves measured from batteries having a lithium manganese oxide cathode and deposited by a method according to an embodiment of the invention.

FIG. 16 shows discharge curves from CC/CV experiments on solid state cells comprising a LMO cathode deposited at a substrate temperature of 225° C. in accordance with the invention. The cells were discharged at various rates ranging from 1 to 45 C in the potential window between 4.0 and 2.5 V vs. Li/Li$^+$. The cells had an area of 1 mm$^2$ and were deposited entirely by physical vapour deposition in ultra-high vacuum, with LMO cathodes and lithium borosilicate electrolytes deposited in accordance with embodiments of the present invention. 300 nm of LMO cathode was deposited directly from lithium, manganese and oxygen sources onto a sapphire substrate coated with 10 nm of TiO$_2$ and 100 nm of Pt. The temperature of the substrate was held at 225° C. throughout the cathode deposition, monitored by an in-situ thermocouple. A solid state electrolyte comprising lithium borosilicate was deposited directly from lithium, boron, silicon and oxygen sources at 225° C. to give a thickness of 800 nm. A SnO$_2$ anode was deposited directly from tin and oxygen, once again at 225° C. to give a thickness of 10 nm. These depositions were carried out within the same vacuum chamber, one after the other. A nickel current collector was deposited by PVD following the completion of the SnO$_2$ layer, and after the sample had cooled to room temperature (17° C.).

Thus, all three of the cathode, electrolyte and anode layers were deposited directly from vapour sources of their component elements, with the same substrate temperature for the deposition of each layer, demonstrating a truly isothermal battery fabrication. This is highly advantageous compared to conventional battery fabrication using different deposition techniques at different temperatures for the different layers, and typically requiring other processing steps such as annealing.

As can be seen from FIG. 16, the initial capacity of these cells when cycled at 1 C is 0.1 µA h, which is equivalent to 19 µA h cm$^{-2}$ µm$^{-1}$; this shows a significant improvement compared with a previous demonstration of a cell with LMO and SnO$_2$ electrodes and using a liquid electrolyte, where discharge capacities of less than 10 µA h cm$^{-2}$ µm$^{-1}$ were reported for a balanced cell (Park, Y. J. et al., J. Power Sources, 88, (2000), 250-254). The results demonstrate that the cell can function at high rates, with rates up to 45 C being demonstrated. High rates are necessary for high power applications where short bursts of power are required.

Figure 17:
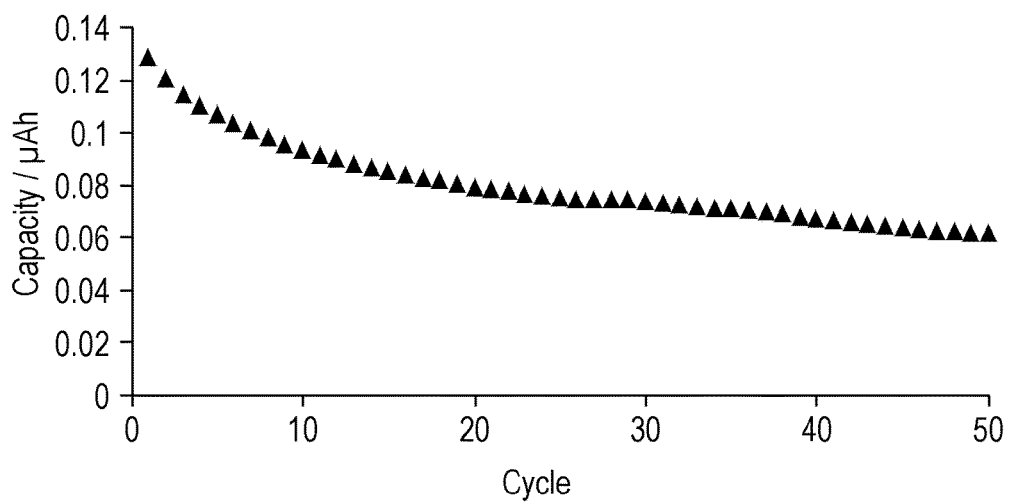
FIG. 17 shows a graph of discharge capacities measured over 50 cycles of one battery having a lithium manganese oxide cathode and deposited by a method according to an embodiment of the invention.

FIG. 17 shows further experimental results for these cells, in the form of a plot of discharge capacity over the course of 50 cycles of one cell. The cell was charged and discharged at a rate of 1 C between 4.0 and 2.5 V. An initial capacity loss is observed during the first 20 cycles, but after this the capacity retention is reasonably good which demonstrates that a rechargeable cell has been produced.

Experimental Battery Results: LMNO Cathode Deposited at 350° C.

In the same manner as LMO, LMNO deposited according to embodiments of the invention at a substrate temperature of 350° C. has been demonstrated to be electrochemically active.

A half cell of lithium manganese nickel oxide (LMNO) was created by using a method according to an embodiment of the invention to co-deposit lithium, manganese, nickel and oxygen at the appropriate ratio, at a substrate temperature of 350° C. An electrochemical array, composed of a silicon/silicon nitride substrate and platinum pads was used as a substrate in this case. The half cell was completed using 1 M LiPF$_6$ in EC:DMC=1:1 as the electrolyte and lithium metal as the counter electrode.

Figure 18:
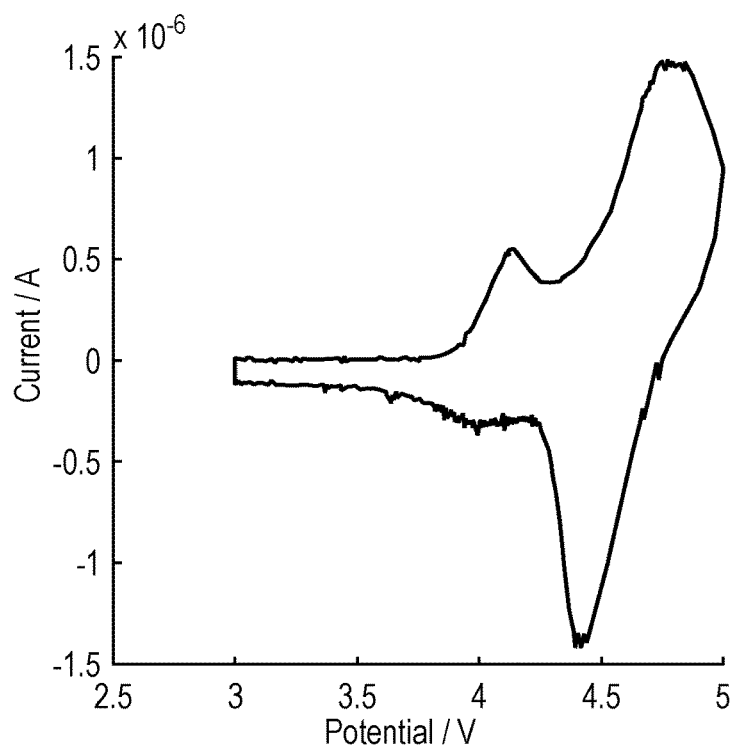
FIG. 18 shows a measurement of cyclic voltammetry from a half cell having a lithium manganese nickel oxide cathode and deposited in accordance with an embodiment of the invention.

FIG. 18 shows the results of cyclic voltammetry performed on this cell, over the first cycle. These measurements were carried out at a sweep rate of 1 mV s$^{-1}$ between 3 and 5 V, giving an equivalent charge rate of 1.8 C. Peaks can be clearly seen during the charge at 4.1 V and 4.7 V, which indicate the presence of both Mn$^{3+}$ and Ni$^{2+}$ in the films. From this, it can be supposed that an oxygen deficient LMNO had been produced, with the composition LiMn$_{1.6}$Ni$_{0.6}$O$_{4-\delta}$ (where δ is between 0 and 0.5).

Figure 19:
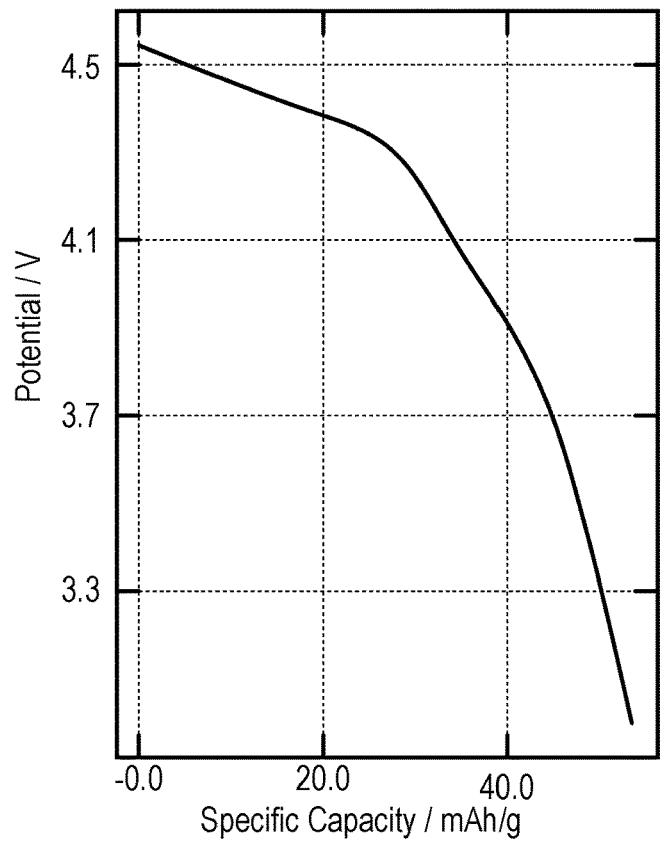
FIG. 19 shows a discharge curve measured from the cell featured in FIG. 18.

FIG. 19 shows the corresponding discharge curve. From this it can be seen that the discharge capacity for this half cell of LMNO vs. Li in liquid electrolyte is 53 mA h g$^{-1}$, which is 36% of the theoretical capacity for LiMn$_{1.5}$Ni$_{0.5}$O$_4$.

Additionally, a full solid state cell with a LMNO cathode deposited according to an embodiment of the invention at a substrate temperature of 350° C. was fabricated and tested. This cell was deposited entirely by physical vapour deposition. The LMNO cathode was deposited directly from lithium, manganese, nickel and oxygen sources onto a sapphire substrate coated with 10 nm of TiO$_2$ and 100 nm of platinum and held at 350° C. throughout the deposition, monitored by an in-situ thermocouple. A solid state electrolyte of lithium borosilicate was deposited directly from lithium, boron, silicon and oxygen sources at 225° C. The substrate was cooled controllably between deposition of the cathode and the electrolyte. A SnO$_2$ anode was deposited directly from tin and oxygen vapour source, once again at 225° C. These depositions were carried out within the same vacuum chamber, one after the other. Following completion of the SnO$_2$ layer and once the sample had cooled to room temperature (17° C.), a nickel current collector was deposited (by PVD).

Thus, all three of the cathode, electrolyte and anode layers were deposited directly from vapour sources of their component elements using a substrate temperature range of only 125° C. across the deposition process. This demonstrates an approximately isothermal battery fabrication, which is again highly advantageous compared to conventional thin film battery fabrication techniques. Small adjustments to the substrate temperature for each layer can enable deposition to be optimised for each material while still allowing a single fabrication procedure to be used for the whole battery.

Figure 20:
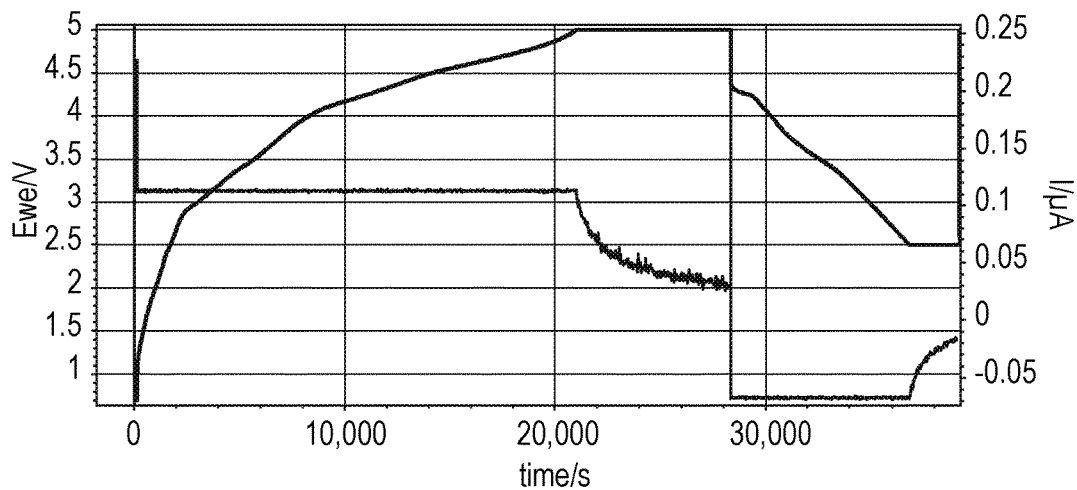
FIG. 20 shows charge and discharge curves measured from batteries having a lithium manganese nickel oxide cathode and deposited by a method according to an embodiment of the invention.

FIG. 20 shows charge and discharge curves from CC/CV experiments on this cell, in the form of the first cycle, when cycled between 5.0 V and 3.0 V in a glove box. In this case the initial discharge capacity is as high as 62% of the theoretical capacity of the cathode, and equivalent to 40.9 $\mu$A h cm$^{-2}$ $\mu$m$^{-1}$. Although the LMNO was deposited at 350° C. in this example, the XRD of LMNO deposited using this method at substrate temperatures as low as 150° C. shows the films to be crystalline. It can therefore be expected that thin film cells containing LMNO deposited at temperatures at and above 150° C. can successfully be produced.

Experimental Results: Demonstration of Stacking Thermally Compatible Materials

As has been mentioned above, a problem when fabricating thin film batteries is how to manage steps involving high temperatures, such as annealing to crystallise the cathode layer, when some of the component layers, such as the amorphous electrolyte, should not be exposed to high temperatures. In a single cell, this can sometimes be managed by depositing layers in an appropriate order, for example, depositing and annealing the cathode layer before depositing the electrolyte over the cathode. This solution becomes less practical as the number of layers in a device increases, however, since the likelihood of being able to deposit all layers needing a heat treatment before depositing all layers that need to avoid heat exposure will typically decreases with the number of layers. For example, the stacking of two or more cells is not feasible, since the cathodes of the second and any subsequent cells will have to be deposited over the electrolytes of the first and any other previous cells. Thus, the fabrication of multiple layered thin film structures using conventional deposition techniques is very difficult, and in some cases impossible.

The present invention provides a solution to this problem. The ability to perform isothermal or quasi-isothermal deposition of layers of a variety of both crystalline and amorphous compounds enables many layers to be built up without the fabrication of any layer affecting the character and quality of any preceding layer. The fabrication of many multi-layer structures and devices is made possible.

To demonstrate this, an array of cells were deposited. In addition to the cathode/electrolyte/anode/current collector structures described above, an array of further cells was deposited on top. In this case, the cathode layers of the second cells were deposited directly onto the current collector layer of the underlying cell. This generated a stack of materials, with a second cell on top of a first cell. This structure was produced entirely using the above-described physical vapour deposition method, with deposition of the component elements of the various compounds from vapour sources directly onto the substrate or previously deposited layer, with some small changes in temperature between the layers. A masking scheme was used to produce the structure, defining the array of second cells on top of a single underlying first cell. For the underlying cell, the first LMO cathode was deposited directly from lithium, manganese and oxygen sources onto a sapphire substrate, coated with 10 nm of TiO$_2$ and 100 nm of platinum as the cathode current collector. The temperature of the substrate was held at 350° C. throughout the deposition, monitored by an in-situ thermocouple. Then, a solid state electrolyte comprising lithium borosilicate was deposited directly from lithium, boron, silicon and oxygen sources with the substrate temperature at 225° C. A SnO$_2$ anode was deposited directly from tin and oxygen sources, with the substrate again held at 225° C. A nickel current collector was deposited (by PVD) following the completion of the SnO$_2$ layer and after the sample had cooled to room temperature (17° C.). Following this, the array of second cells was deposited, following the alignment defined by the mask. For each, a second LMO cathode was deposited directly from lithium, manganese and oxygen sources on to the nickel current collector of the first cell, with a substrate temperature of 350° C. A second lithium borosilicate solid electrolyte layer was then deposited directly from the elements using lithium, boron, silicon, and oxygen sources with the substrate temperature at 225° C. A SnO$_2$ anode was deposited directly from tin and oxygen, once again at 225° C., and a top nickel current collector was deposited (by PVD) after the sample had cooled to room temperature (17° C.). Thus, the upper cells were deposited in the same way as the lower cell, with the deposition process of the upper cells having no detrimental effect on the layers of the lower cells owing to the small range of temperatures within the quasi-isothermal procedure. These depositions were carried out within the same vacuum chamber, one after the other.

FIG. 21(a) shows a SEM image of this two cell stack, with the various layers visible. The image shows the sapphire substrate D0 in the top right corner, with the two cells deposited onto it. The platinum current collector layer is marked by D1. This layer is 100 nm thick and deposited as part of the substrate processing. The first cathode layer, comprising LMO, is marked by D2 and is 314 nm thick. The first solid state electrolyte layer, comprising lithium borosilicate (LBSO) is marked by D4 and is 418 nm thick. The tin oxide layer anode is too thin to elucidate by SEM (approximately 8 nm), so is not marked. The nickel current collector and 2$^{nd}$ cathode layer, again LMO, is marked by D3. The second solid state electrolyte layer, again LBSO, is marked by D5, and finally, the combined SnO$_2$ layer (the second anode) and second nickel current collector layer is marked by D6.

FIG. 21(b) shows a schematic representation of the SEM image, to better indicate the various layers. The different layers are labelled with their corresponding materials.

The SEM images show a clear and well-defined structure of the layers, demonstrating that deposition of stacked cells can be achieved using a method according to an embodiment of the invention without significant disruption of the layers. This opens up the possibility of simple fabrication of multi-layer and stacked devices. An important feature to note is the clear interfaces between the layers, arising from the smooth surface that the present deposition method produces. This allows the use of thinner layers since surface features do not protrude across layers, giving smaller devices, reduced material costs and reduced times for deposition and overall device fabrication.

Figure 21:
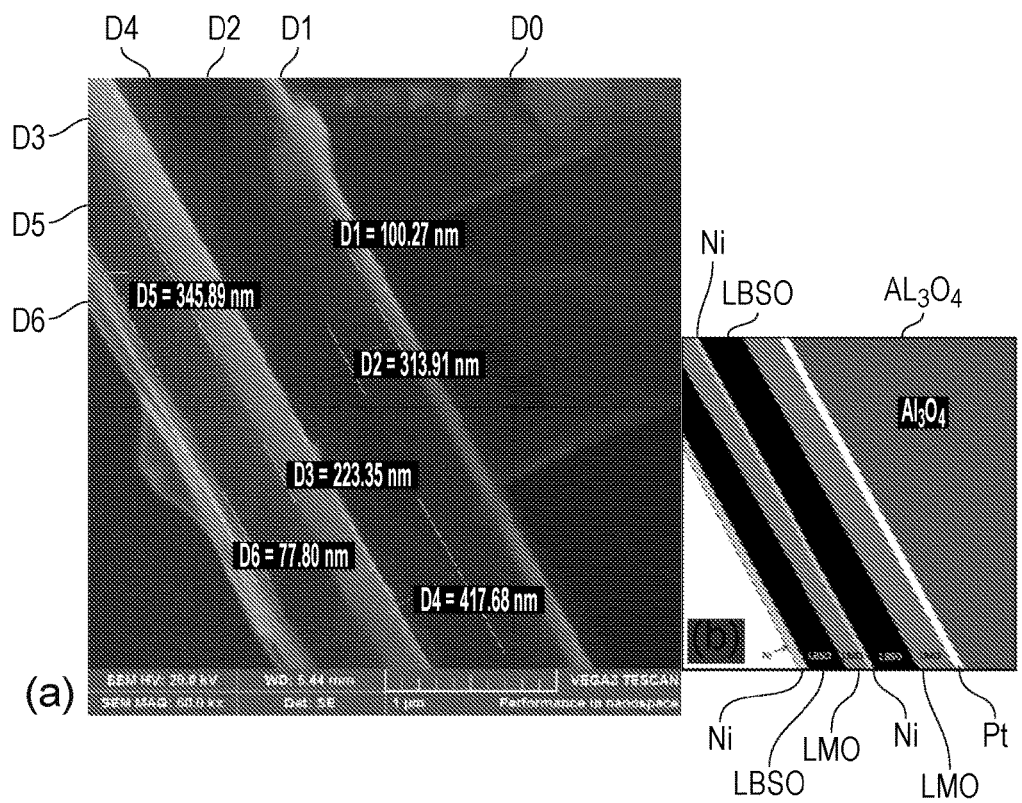
FIGS. 21(a) and 21(b) show respectively a scanning electron microscope image of a two cell stack fabricated in accordance with embodiments of the invention, and a schematic representation of the layers in this stack.
Figure 22:
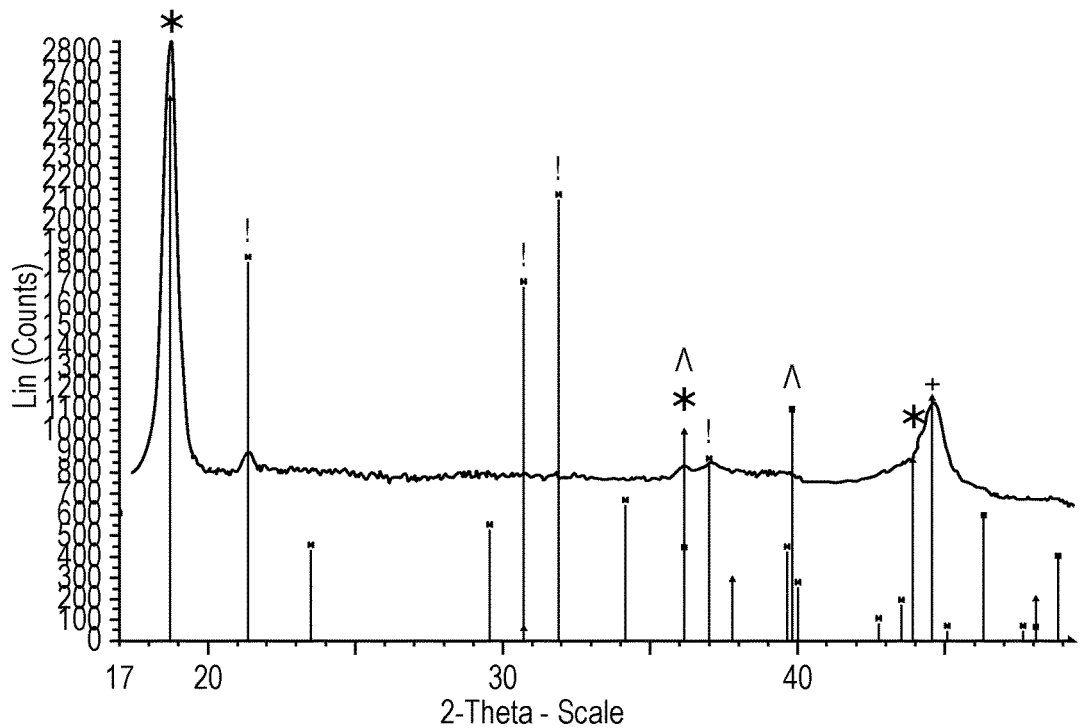
FIG. 22 shows a plot of X-ray diffraction data measured from the cell stack of FIG. 21.

FIG. 22 shows a plot of X-ray diffraction data collected on the cell stack shown in FIG. 21. These results demonstrate that the sequential deposition of one stack on top of another, including the deposition of a LMO cathode at 350° C. for 2 hours onto a pre-existing cell with an amorphous electrolyte, does not cause crystallization of the solid state electrolyte. The only crystalline components (indicated by peaks in the graph) observed are those of platinum (within the substrate), nickel (the current collectors), $Al_2O_3$ (the sapphire substrate), $LiMn_2O_4$ (the crystalline cathode), and lithium carbonate, $Li_2CO_3$. Reference lines are included on the graph to indicate the different peaks, as follows: platinum (00-004-0802), symbol "^"; nickel (00-004-0850), symbol "+"; sapphire ($Al_2O_3$) (00-010-0173); $LiMn_2O_4$ (00-035-0782), symbol "*"; and $Li_2CO_3$ (00-022-1141) symbol "!". Crystalline lithium carbonate is noted to occur when the solid state electrolyte is exposed to air; therefore this data originates from regions of the solid state electrolyte which are not protected by the overlaying anode and current collectors.

The LMO was deposited at 350° C. in this two stack example. However, the X-ray diffraction measurements on LMO deposited at substrate temperatures as low as 150° C. show the films to be crystalline (see FIG. 7), so it can be expected that a thin film cell containing LMO deposited at temperatures of 150° C. or above would be able to be cycled successfully. Similarly, the results presented above for LMNO show crystallisation across a similar range of substrate temperatures, so this material could also be used for the cathode.

Figure 23:
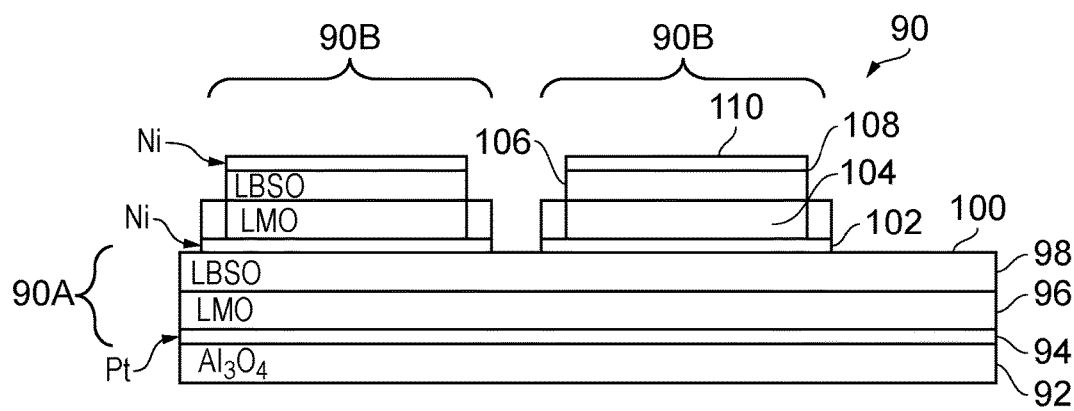
FIG. 23 shows a schematic side view representation of a two cell stack.

FIG. 23 shows a schematic side view of the two cell stack, to better illustrate the arrangement of the various layers. The stack 90 comprises the lower cell 90A, and the array of upper cells 90B adjacent each other on top of the lower cell 90A, all arranged on the sapphire substrate 92, with its platinum coating forming the current collector layer 94. In the lower cell 90A there are the LMO cathode 94, the LBSO electrolyte 98, and the $SnO_2$ anode 100. Each upper cell 90B comprises a nickel current collector 102, a LMO cathode 104, a LBSO electrolyte 108, a $SnO_2$ anode 108 and a nickel current collector 110.

Figure 24:
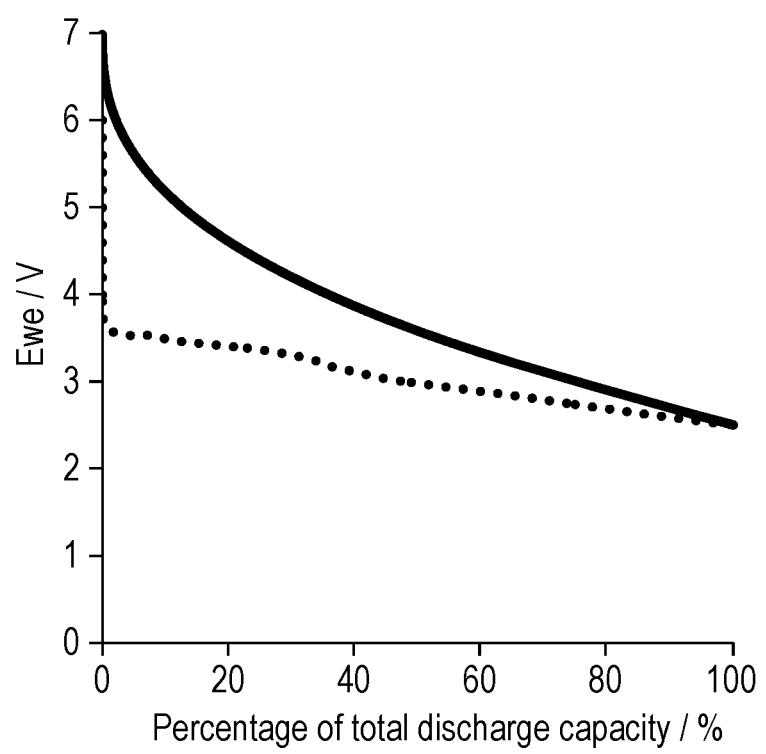
FIG. 24 shows a charge and discharge curve measured from batteries having a lithium manganese nickel oxide cathode and deposited by a method according to an embodiment of the invention.

FIG. 24 shows a discharge curve for a two stack cell after charging to 7 V (solid curve) compared with a discharge curve for a single cell charged to 6 V (dotted curve). From these measurements it can be clearly seen that for a single cell the discharge potential which corresponds to the LMO/$SnO_2$ chemistry is all below 3.75 V, with no capacity observed above 4 V even when a cell is charged to a potential as high as 6 V. It is well known that when cells are connected in series the potential is increased by the addition of the single cell potentials. The discharge curve for the two stack cell where the cells are connected in series demonstrates an increase in potential compared to the single cell with a significant proportion of the capacity delivered at potentials above 4 V, thereby proving that both the cells are contributing to the overall potential.

Temperature

From the various results presented above, it can be seen that there is a substrate temperature range spanning about 170° C., from about 180° C. to 350° C., for which both amorphous lithium-containing oxide and oxynitride compounds and crystalline lithium-containing transition metal compounds can be deposited. Therefore, operating within this temperature range allows the deposition of multiple layers of different materials in a single fabrication process with little or no adjustment of temperature. Operating at a single temperature for all layers can be referred to as "isothermal", whereas operating within a temperature range spanning about 170° C. or less can be considered as "quasi-isothermal". This term is a reasonable description when the process is compared with the range of temperatures typically required to produce layers of these materials using conventional techniques. Amorphous compounds are generally prepared at room temperature (say between 17° C. and 25° C.), whereas temperatures for producing a crystalline compounds by either or both of annealing and depositing onto a high temperature substrate are typically at least 500° C. Hence, the range of 170° C. according to the present invention is "quasi-isothermal" when compared to the known range of typically 475° C. or more.

Of course, a range of temperatures smaller than 170° C. can be used, with the range chosen to optimise the process overall. For example, a small temperature range of 25° C. or 50° C. places less demand on the heating component, and requires less time between depositing different layers for the substrate to reach each required temperature. These benefits also apply to using a constant temperature for all layers, of course. A larger range such as 75° C., 100° C. or 150° C. might be preferred in other circumstances, for example, to keep the temperature for the amorphous material low to save energy while using a higher temperature for the crystalline material to increase crystal size. For example, some of the examples above include a cathode deposited at 350° C. and an electrolyte deposited at 225° C., giving a range of 75° C. The various ranges can apply to other upper and lower temperatures too.

Further Materials

Thus far, the fabrication of amorphous lithium borosilicate and nitrogen-doped lithium borosilicate and crystalline LMO and LMNO has been described in detail. However, the invention is not limited to these materials, and the process of deposition of the component elements directly onto a heated substrate is applicable to the production of other lithium containing oxide and oxynitride compounds. Further examples include lithium silicates and lithium borates, and compounds including other glass-forming elements such as germanium, aluminium, arsenic and antimony. Amorphous oxides and oxynitrides can be expected to be able to be prepared by methods according to the invention, since the chemistry of binary oxides can be expected to be very similar to that of the ternary oxide/oxynitride glasses. Similarly, the process of deposition of the component elements directly onto a heated substrate is applicable to the production of other lithium containing transition metal oxides in crystalline form. Any transition metal or metals can be substituted for the manganese and manganese plus nickel embodiments discussed so far. The chemistry of the transition metals is sufficiently similar and predictable across the group that it can be expected that crystalline material will deposit at moderate substrate temperatures using the method of the invention for any lithium-containing transition metal oxide of interest. Materials that are of particular interest for specific applications are $LiCoO_2$, $LiNiO_2$, $LiCo_{1/3}Ni_{1/3}Mn_{1/3}O_2$ (NMC), $LiNi_{0.8}Co_{0.15}Al_{0.05}O_2$ (NCA) and $LiV_3O_8$ for use as cathodes, and $Li_4Ti_5O_{12}$ for use as anodes. These materials may be used for other applications, however, and other lithium containing transition metal oxides are not precluded.

Substrates

The experimental results presented herein relate to thin films deposited onto titanium and platinum coated sapphire substrates and titanium and platinum coated silicon substrates. Other substrates may be used if preferred however. Other suitable examples include quartz, silica, glass, sapphire, and metallic substrates including foils, but the skilled person will understand that other substrate materials will also be suitable. Requirements for the substrate are that an appropriate deposition surface is provided and that it can withstand the required heating; otherwise the substrate material can be selected as desired with reference to the application to which the deposited compound is to be put.

Also, the embodiments of the invention are applicable equally to the deposition of the component elements directly onto the substrate surface, and onto one or more layers previously deposited or otherwise fabricated on the substrate. This is evident from the experimental results discussed above, where films were deposited onto otherwise empty heated substrates, amorphous electrolyte layers were deposited onto a cathode layer when fabricating sample batteries, and multiple layers were deposited successively when demonstrating a stacked cell. Thus, reference in this application to "a substrate" "depositing onto a substrate", "co-depositing onto a substrate" and similar apply equally to "a substrate supporting one or more pre-fabricated layers", "depositing onto a layer or layers previously fabricated on a substrate", "co-depositing onto a layer or layers previously fabricated on a substrate" and the like. The invention applies equally whether or not there are any other layers intervening between the substrate and any particular amorphous or crystalline layer being deposited.

Applications

The ability of the methods of the present invention to form both amorphous and crystalline thin film materials, combined with properties such as excellent ionic conductivity, smooth surface morphology, and good charge and discharge capacities, make the materials well-suited for use as electrolytes and electrodes in thin film batteries, and this is expected to be a major application. The methods of the invention are readily adaptable to the manufacture of battery components within devices such as sensors, photovoltaic cells and integrated circuits and the like, where both single cells and stacked cells can be provided. However, the materials are not limited to use as battery components, and the method may be used to deposit layers of amorphous lithium-containing oxide or oxynitride compounds and crystalline lithium-containing transition metal oxides for any other applications. Possible examples include sensors, lithium separators, interface modifiers and ion conductors within electrochromic devices.

Also, thin films may be deposited according to the invention in an adjacent arrangement rather than a layered arrangement.

REFERENCES

[1] Tang, S. B., et al., J. Solid State Chem., 179(12), (2006), 3831-3838
[2] Julien, C. M. and G. A. Nazri, *Chapter 4. Materials for electrolyte: Thin Films, in Solid State Batteries: Materials Design and Optimization* (1994)
[3] Thornton, J. A. and J. E. Greene, *Sputter Deposition Processes, in Handbook of Deposition Technologies for films and coatings*, R. F. Bunshah, Editor 1994, Noyes Publications
[4] Wang et al. Electrochimica Acta 102 (2013) 416-422
[5] WO 2013/011326
[6] WO 2013/011327
[7] Singh et al. J. Power Sources 97-98 (2001), 826-831
[8] Jayanth et al. Appl Nanosci. (2012) 2:401-407
[9] Baggetto et al., J Power Sources 211 (2012) 108-118
[10] Zhong, Q., et al., J. Electrochem. Soc., (1997), 144(1), 205-213
[11] Bates et al. Synthesis, Crystal Structure, and Ionic Conductivity of a Polycrystalline Lithium Phosphorus Oxynitride with the γ-Li3PO4 Structure. *Journal of Solid State Chemistry* 1995, 115, (2), 313-323
[12] WO 2001/73883
[13] EP 1,305,838
[14] Julien, C. M.; Nazri, G. A., Chapter 1. Design and Optimisation of Solid State Batteries. In *Solid State Batteries: Materials Design and Optimization,* 1994
[15] Bates, J. B.; Gruzalski, G. R.; Dudney, N. J.; Luck, C. F.; Yu, X., Rechargeable Thin Film Lithium Batteries. *Oak Ridge National Lab and Solid State Ionics* 1993
[16] U.S. Pat. No. 5,338,625
[17] Tatsumisago, M.; Machida, N.; Minami, T., Mixed Anion Effect in Conductivity of Rapidly Quenched $Li_4SiO_4$—$Li_3BO_3$ Glasses. *Yogyo-Kyokai-Shi* 1987, 95, (2), 197-201
[18] Machida, N.; Tatsumisago, M.; Minami, T., Preparation of amorphous films in the systems $Li_2O_2$ and $Li_2O$—$B_2O_{3-Si}O_2$ by RF-sputtering and their ionic conductivity. *Yogyo-Kyokai-Shi* 1987, 95, (1), 135-7
[19] Varshneya, A. K., *Fundamentals of Inorganic Glasses*, Academic Press, page 33
[20] Guerin, S. and Hayden, B. E., *Journal of Combinatorial Chemistry* 8, 2006, pages 66-73
[21] WO 2005/035820
[22] Park, Y. J. et al., J. Power Sources, 88, (2000), 250-254

The invention claimed is:

1. A vapour deposition method for preparing a multi-layered thin film structure, the method comprising:
    providing a vapour source of each component element of a compound intended for a first layer and a compound intended for a second layer, wherein the vapour sources comprise at least a source of lithium, a source of oxygen, a source or sources of one or more glass-forming elements, and a source or sources of one or more transition metals;
    heating a substrate from a backside of the substrate to a first temperature;
    co-depositing component elements from at least the vapour sources of lithium, oxygen and the one or more transition metals onto a front side of the heated substrate wherein the component elements react on the substrate to form a layer of a crystalline lithium-containing transition metal oxide compound;
    heating the substrate from the backside of the substrate to a second temperature; and
    co-depositing component elements from at least the vapour sources of lithium, oxygen and the one or more glass-forming elements onto the front side of the heated substrate wherein the component elements react on the substrate to form a layer of an amorphous lithium-containing oxide or oxynitride compound;
    wherein the first temperature and the second temperature fall within a temperature range, wherein a span of the temperature range is 170° C. or less.

2. The vapour deposition method according to claim 1, in which the layer of a crystalline lithium-containing transition metal oxide compound is deposited before the layer of an amorphous lithium-containing oxide or oxynitride compound, such that the layer of crystalline lithium-containing transition metal oxide compound underlies the layer of an amorphous lithium-containing oxide or oxynitride compound.

3. The vapour deposition method according claim 1, wherein the first temperature and the second temperature are each between 180° C. and 350° C.

4. The vapour deposition method according to claim 1, in which the source or sources of one or more transition metals comprise a source of:
   a. manganese and the crystalline lithium-containing metal oxide compound is lithium manganese oxide;
   b. a source of manganese and a source of nickel and the crystalline lithium-containing metal oxide compound is lithium manganese nickel oxide; or,
   c. one or more of scandium, titanium, vanadium, chromium, manganese, iron, cobalt, nickel, copper, zinc, yttrium, zirconium, niobium, molybdenum, technetium, ruthenium, rhodium, palladium, silver, cadmium, lutetium, hafnium, tantalum, tugsten, rhenium, osmium, iridium, platinum, gold and mercury.

5. The vapour deposition method according to claim 1, in which the vapour sources further comprise a source of nitrogen, and the amorphous compound is a lithium-containing oxynitride compound.

6. The vapour deposition method according to claim 1, in which the source or sources of one or more glass-forming elements comprises:
   a. source of boron and a source of silicon, and the amorphous lithium-containing oxide or oxynitride compound is lithium borosilicate; or
   b. a source of boron, a source of silicon and a source of nitrogen, and the amorphous lithium-containing oxide or oxynitride compound is nitrogen-doped lithium borosilicate.

7. The vapour deposition method according to claim 1, in which the amorphous lithium-containing oxide or oxynitride compound is a lithium silicate, an oxynitride lithium silicate, a lithium borate or an oxynitride lithium borate.

8. The vapour deposition method according to claim 1, in which the source or sources of one or more glass-forming elements comprises sources of one or more of boron, silicon, germanium, aluminium, arsenic and antimony.

9. The vapour deposition method according to claim 1, in which the layer of an amorphous lithium-containing oxide or oxynitride compound is deposited onto the layer of a crystalline lithium-containing transition metal oxide compound.

10. The vapour deposition method according to claim 1, in which the layer of crystalline lithium-containing transition metal oxide compound is deposited to form a cathode of a thin film battery and the layer of an amorphous lithium-containing oxide or oxynitride compound is deposited to form an electrolyte of a thin film battery.

11. The vapour deposition method according to claim 1, and further comprising forming one or more further layers on the layer of an crystalline lithium-containing transition metal oxide compound and/or the layer of an amorphous lithium-containing oxide or oxynitride compound.

12. The vapour deposition method according to claim 11, in which at least one further layer is formed by co-depositing component elements of a compound intended for the further layer from vapour sources of each component element of that compound onto the substrate wherein the component elements react on the substrate to form a layer of the compound intended for the further layer.

13. The vapour deposition method according to claim 12, in which the substrate is heated to a third temperature when the third layer is formed, wherein;
   a. the first temperature, the second temperature and the third temperature fall within the temperature range having the span of 170° C. or less; or,
   b. the first temperature, the second temperature and the third temperature are equal.

14. The vapour deposition method according to claim 11, in which the layer of crystalline lithium-containing transition metal oxide compound is deposited to form a cathode of a first thin film battery, the layer of an amorphous lithium-containing oxide or oxynitride compound is deposited to form an electrolyte of the first thin film battery, and the one or more further layers comprise at least an anode of the first thin film battery, and a cathode, electrolyte, and anode of a second thin film battery formed on the first thin film battery to form a battery stack.

15. A method of making a battery using the vapour deposition method according to claim 1, the method comprising: depositing a cathode of the battery as the layer of the crystalline lithium-containing transition metal oxide compound and depositing an electrolyte of the battery as the layer of the amorphous lithium-containing oxide or oxynitride compound.

* * * * *